(12) United States Patent
Bernstein et al.

(10) Patent No.: US 7,591,201 B1
(45) Date of Patent: Sep. 22, 2009

(54) MEMS STRUCTURE HAVING A COMPENSATED RESONATING MEMBER

(75) Inventors: David H. Bernstein, Oakland, CA (US); Roger T. Howe, Los Gatos, CA (US); Emmanuel P. Quevy, El Cerrito, CA (US)

(73) Assignee: Silicon Clocks, Inc., Fremont, CA (US)

( * ) Notice: Subject to any disclaimer, the term of this patent is extended or adjusted under 35 U.S.C. 154(b) by 294 days.

(21) Appl. No.: 11/716,285

(22) Filed: Mar. 9, 2007

(51) Int. Cl.
*F16H 33/14* (2006.01)

(52) U.S. Cl. ............................................. 74/3.2; 74/2

(58) Field of Classification Search .............. 74/2, 74/3.2
See application file for complete search history.

(56) References Cited

U.S. PATENT DOCUMENTS

| | | | |
|---|---|---|---|
| 6,557,419 B1 | 5/2003 | Herb et al. | |
| 6,686,807 B1 * | 2/2004 | Giousouf et al. | 331/154 |
| 6,708,491 B1 * | 3/2004 | Weaver et al. | 60/527 |
| 6,739,190 B2 | 5/2004 | Hsu et al. | |
| 6,987,432 B2 | 1/2006 | Lutz et al. | |
| 7,023,065 B2 | 4/2006 | Ayazi et al. | |
| 7,071,793 B2 | 7/2006 | Lutz et al. | |
| 7,202,761 B2 | 4/2007 | Lutz et al. | |
| 7,211,926 B2 | 5/2007 | Quevy et al. | |
| 7,300,814 B2 * | 11/2007 | Cunningham et al. | 438/50 |
| 7,350,424 B2 * | 4/2008 | Hjelt et al. | 73/862.041 |
| 7,495,199 B2 * | 2/2009 | Jankowiak | 250/200 |
| 2005/0250236 A1 | 11/2005 | Takeuchi et al. | |
| 2006/0033594 A1 | 2/2006 | Lutz et al. | |
| 2006/0186971 A1 | 8/2006 | Lutz et al. | |
| 2008/0105951 A1 * | 5/2008 | Sato et al. | 257/619 |
| 2008/0224241 A1 * | 9/2008 | Inaba et al. | 257/415 |

OTHER PUBLICATIONS

Office Action from U.S. Appl. No. 11/801,774 mailed Apr. 30, 2008, 14 pgs.

Office Action from U.S. Appl. No. 11/716,115, mailed Oct. 6, 2008, 19 pgs.

Guckel, H., et al., "Diagnostic Microstructures for the Measurement of Intrinsic Strain in Thin Films", J. Micromech. Microeng. 2, 1997, United Kingdom, (1997), 10 pgs.

Quevy, Emmanuel P., et al., "Method for Temperature Compensation in MEMS resonators with Isolated Regions of Distinct Material", U.S. Appl. No. 11/716,115, filed Mar. 9, 2007, 45 pgs.

Quevy, Emmanuel P., et al., "Redundant MEMS Resonators for Precise Reference Oscillators", IEEE Radio Frequency Integrated Circuits Symposium, Jun. 12-14, 2005, Long Beach, CA, (2005), 4 pgs.

Omura, Yoshiteru et al., "New Resonant Accelerometer Based on Rigidity Change," International Conference on Solid-State Sensors and Actuators, Jun. 16-19, 1997, pp. 855-858.

Shen, F. et al., "Thermal Effects on Coated Resonant Microcantilevers," Elsevier, Sensors and Actuators, A 95, (2001), pp. 17-23.

Jianqiang, Han et al., "Dependence of the Resonance Frequency of Thermally Excited Microcantilever Resonators on Temperature," Elsevier, Sensors and Actuators, A 101, (2002), pp. 37-41.

* cited by examiner

*Primary Examiner*—David M Fenstermacher
(74) *Attorney, Agent, or Firm*—Blakely Sokoloff Taylor & Zafman

(57) ABSTRACT

A MEMS structure having a compensated resonating member is described. In an embodiment, a MEMS structure comprises a resonating member coupled to a substrate by an anchor. A dynamic mass-load is coupled with the resonating member. The dynamic mass-load is provided for compensating a change in frequency of the resonating member by altering the moment of inertia of the resonating member by way of a positional change relative to the anchor.

18 Claims, 24 Drawing Sheets

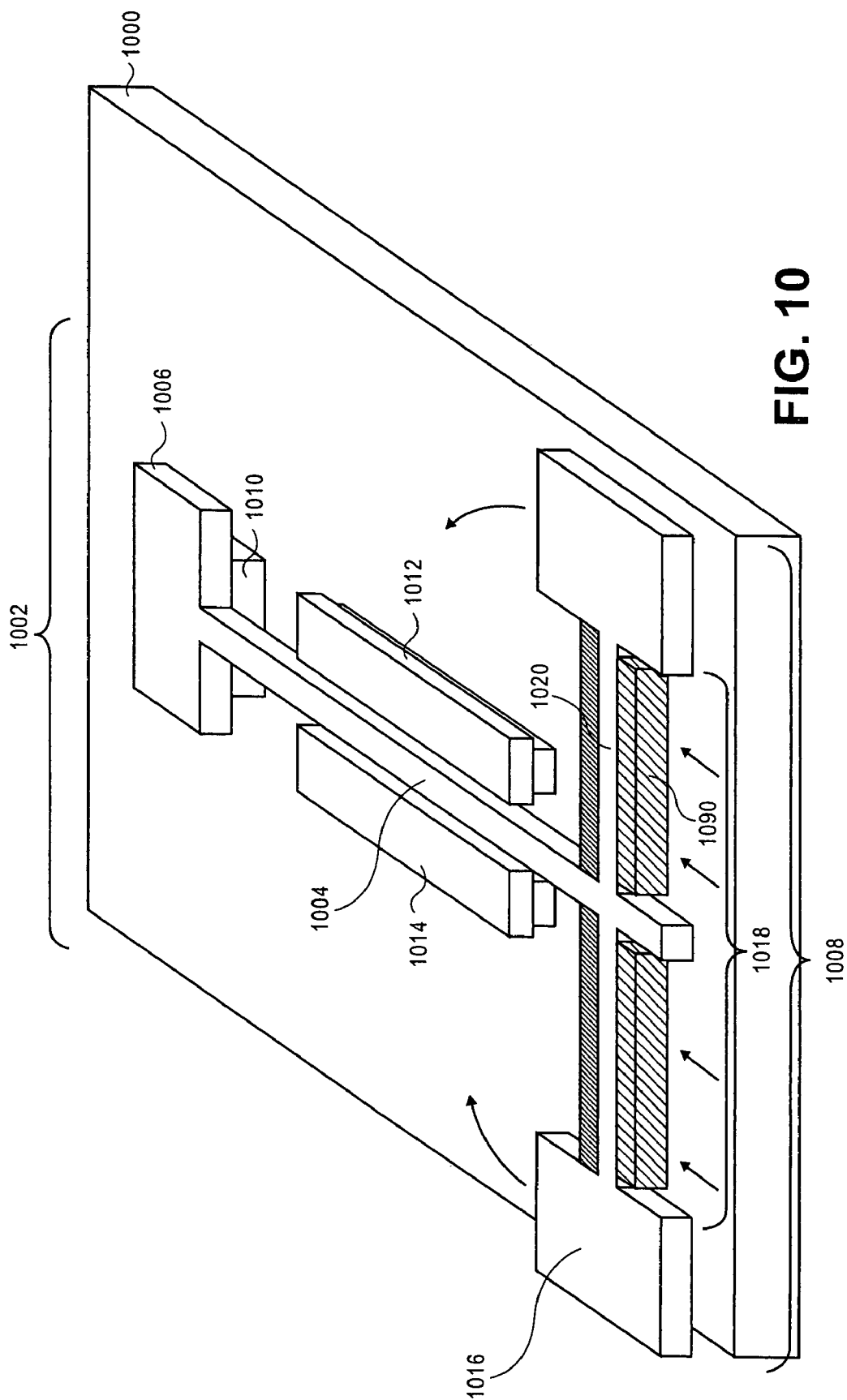

MEMS STRUCTURE HAVING A COMPENSATED RESONATING MEMBER

BACKGROUND OF THE INVENTION

1) Field of the Invention

The invention is in the field of Microelectromechanical Systems (MEMS).

2) Description of Related Art

For the past several years, MEMS structures have been playing an increasingly important role in consumer products. For example, MEMS devices, such as sensors, detectors and mirrors, can be found in products ranging from air-bag triggers in vehicles to displays in the visual arts industry. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictate that the processes used to fabricate such MEMS devices need to be extremely sophisticated.

MEMS resonators are also becoming more prevalent. For example, motion sensors may be fabricated from a resonant accelerometer. FIG. 1 illustrates a cross-sectional view representing a MEMS structure having a resonant accelerometer, in accordance with the prior art.

Referring to FIG. 1, a MEMS structure 100 comprises a resonating member 102 coupled to an anchor 104 and a mass 106. In response to a motion, i.e. a positional displacement of MEMS structure 100, mass 106 oscillates in the direction of arrow 108. The oscillation of mass 106 alters the rigidity of resonating member 102, thus modifying the resonant frequency of resonating member 102. This change in resonant frequency may be detected to indicate that a positional displacement has occurred.

In another example, a clocking device may be fabricated from a MEMS resonator. For a reliable clocking device, however, very little to no change of the vibrational frequency of the MEMS resonator may be acceptable. This can prove difficult because many MEMS resonators undergo undesirable frequency fluctuations in response to environmental changes. Thus, a MEMS structure having a compensated resonating member is described herein.

BRIEF DESCRIPTION OF THE DRAWINGS

FIG. 10 illustrates a cross-sectional view representing a MEMS structure having a compensated resonating member and a dynamic mass-load comprising more than two materials with mismatched thermal coefficients of expansion, in accordance with an embodiment of the present invention.

DETAILED DESCRIPTION

A MEMS structure having a compensated resonating member and a method to form such a structure are described. In the following description, numerous specific details are set forth, such as material compositions and chemical regimes, in order to provide a thorough understanding of the present invention. It will be apparent to one skilled in the art that the present invention may be practiced without these specific details. In other instances, well-known features, such as lithographic parameters and patterning procedures, are not described in detail in order to not unnecessarily obscure the present invention. Furthermore, it is to be understood that the various embodiments shown in the figures are illustrative representations and are not necessarily drawn to scale.

Disclosed herein is a MEMS structure having a compensated resonating member. In an embodiment, a MEMS structure comprises a resonating member coupled to a substrate by an anchor. A dynamic mass-load is coupled with the resonating member. The dynamic mass-load is for compensating a change in frequency of the resonating member by altering the moment of inertia of the resonating member by way of a positional change relative to the anchor. In a specific embodiment, the dynamic mass-load compensates the resonating member in response to an environmental change selected from the group consisting of temperature, pressure, light, electrical and chemical.

Figure 1:
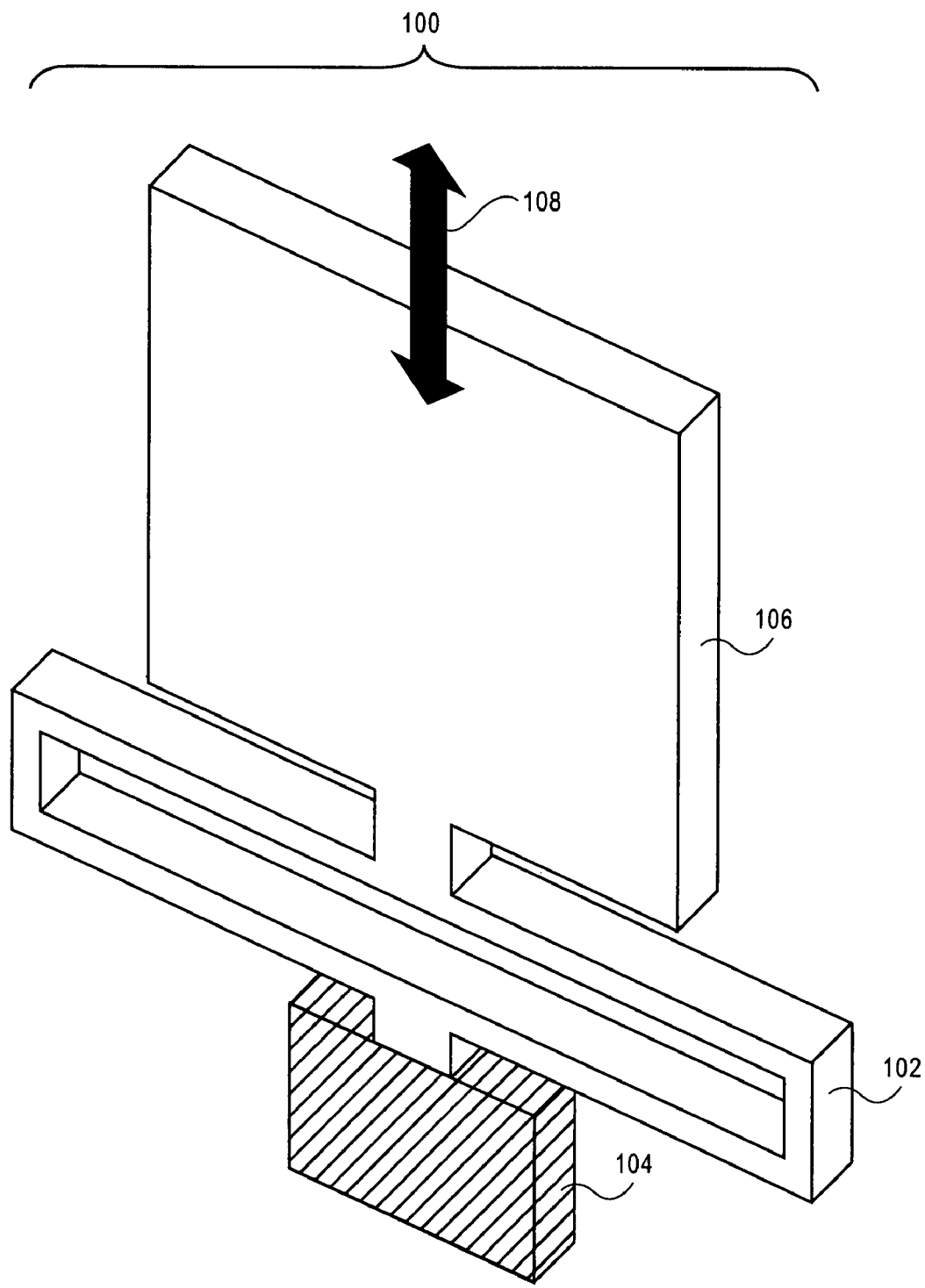
FIG. 1 illustrates a cross-sectional view representing a MEMS structure having a resonant accelerometer, in accordance with the prior art.
Figure 2:
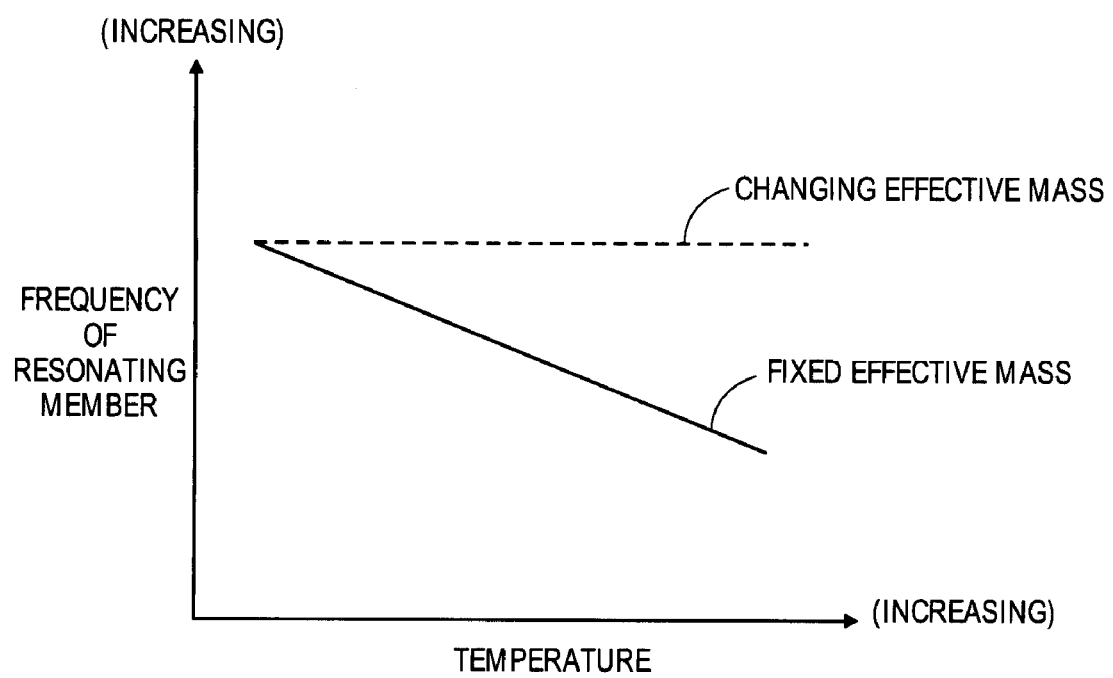
FIG. 2 illustrates a correlation plot representing the frequency of a resonating member as a function of temperature, in accordance with an embodiment of the present invention.

A MEMS structure having a compensated resonating member may enhance the performance and reliability of a MEMS clocking device that incorporates such a MEMS structure. For example, in accordance with an embodiment of the present invention, a MEMS resonator is comprised of a resonating member having a resonant frequency that is a function of temperature. In one embodiment, the resonant frequency of the resonating member decreases in correlation with an increase in temperature. A dynamic mass-load coupled with the resonating member may displace the moment of inertia of the resonating member such that the effective mass of the resonating member is altered. In an embodiment, the effective mass is reduced in response to an increase in temperature and, hence, the relative resonant frequency at a given temperature is increased for a resonating member having a resonant frequency that would otherwise decrease with increasing temperature. Thus, a frequency compensation may be invoked for a resonating member having a resonant frequency that decreases in response to an increase in temperature. In an example, FIG. 2 illustrates a correlation plot representing the frequency of a resonating member as a function of temperature, in accordance with an embodiment of the present invention. Referring to FIG. 2, the resonant frequency of a resonating member with a fixed effective mass decreases with increasing temperature, as represented by the solid line. However, the frequency of the resonating member for a given temperature may be manipulated by altering the effective mass of the resonating member. Thus, in one embodiment, the effective mass of the resonating member is decreased in correlation with an increasing temperature. In a specific embodiment, this dynamic mass compensation provides for a substantially consistent resonant frequency of the resonating member, regardless of temperature, as depicted by the dashed line in FIG. 2.

Figure 3:
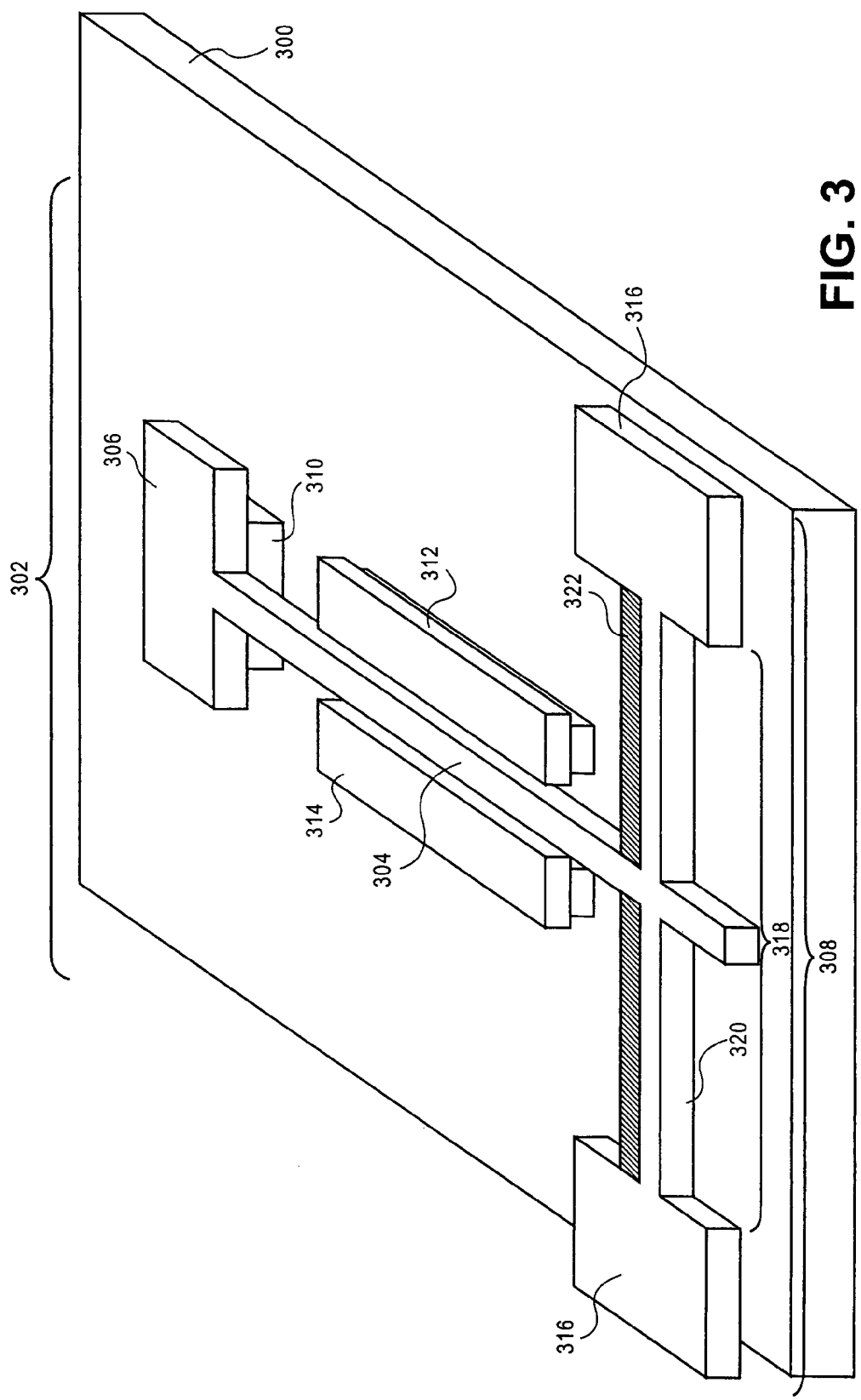
FIG. 3 illustrates a cross-sectional view representing a MEMS structure having a compensated resonating member, in accordance with an embodiment of the present invention.

A MEMS structure may be fabricated having a resonating member coupled with a dynamic mass-load. FIG. 3 illustrates a cross-sectional view representing a MEMS structure having a compensated resonating member, in accordance with an embodiment of the present invention.

Referring to FIG. 3, a MEMS structure 302 comprises a resonating member 304 and a base 306. Resonating member 304 is coupled with a dynamic mass-load 308 and base 306 is coupled with substrate 300 by an anchor 310. Resonating member 304 is suspended between a drive electrode 312 and a sensor electrode 314. Dynamic mass-load 308 comprises a pair of mass units 316 and a two-component arm 318 comprised of a first material 320 and a second material 322.

MEMS structure 302 may be any device that falls within the scope of MEMS technologies. For example, MEMS structure 302 may be any mechanical and electronic structure having a critical dimension of less than approximately 250 microns and fabricated using lithography, deposition, and etching processes above a substrate. In accordance with an embodiment of the present invention, MEMS structure 302 is a device selected from the group consisting of a resonator, a sensor, a detector, a filter and a mirror. In a particular embodiment, MEMS structure 302 is a resonator for use in a clocking circuit. Thus, resonating member 304 may be any suspended feature having a resonant frequency. For example, in an embodiment, resonating member 304 is a feature selected from the group consisting of a beam, a plate and a tuning fork. In a specific embodiment, resonating member 304 is a cantilever arm, as depicted in FIG. 3.

Resonating member 304 may have any dimensions suitable for a desired MEMS function. For example, in accordance with an embodiment of the present invention, MEMS structure 302 is a resonator comprised of a resonating cantilever arm 304. The height of resonating member 304 is in the range of 0.1-10 microns and the width is in the range of 0.1-100 microns. In one embodiment, the length of resonating member 304 is in the range of 70-90 microns, the height of resonating member 304 is in the range of 0.5-5 microns and the width of resonating member 304 is in the range of 0.5-5 microns. The distance that resonating member 304 is suspended above substrate 300 may be selected to mitigate the acoustic back-scattering for a desired MEMS function. In an embodiment, MEMS structure 302 is a clocking device and resonating member 304 is suspended at a distance in the range of 0.1-5 microns above substrate 300. The spacing between resonating member 304 and electrodes 312 and 314 may be sufficient to generate and collect high quality signals without interfering with a resonating mode of resonating member 304. In one embodiment, the spacing between resonating member 304 and each of electrodes 312 and 314 is in the range of 100-500 nanometers.

Resonating member 304, and thus base 306, may be comprised of any material suitable to withstand a MEMS fabrication process. For example, in accordance with an embodiment of the present invention, resonating member 304 is comprised of a material selected from the group consisting of an insulator, a semiconductor and a conductor. In one embodiment, resonating member 304 is comprised of an insulating material selected from the group consisting of silicon dioxide, silicon nitride, silicon oxy-nitride and a high-K dielectric material. In one embodiment, resonating member 304 is comprised of a semiconducting material selected from the group consisting of silicon, germanium, silicon/germanium, carbon-doped silicon, carbon-doped silicon/germanium and a III-V material. The semiconducting material may also be comprised of dopant impurity atoms. For example, in a specific embodiment, resonating member 304 is comprised of polycrystalline silicon/germanium with a germanium atomic concentration in the range of 50-70% and boron dopant impurity atoms with a total atomic concentration in the range of $1\times10^{18}$-$5\times10^{20}$ atoms/cm$^3$. In one embodiment, resonating member 304 is comprised of a conductor and is formed from a material selected from the group consisting of copper, aluminum, a metal alloy and a metal silicide.

Dynamic mass-load 308 comprises a pair of mass units 316 and a two-component arm 318 having a first material 320 and a second material 322. Mass units 316 and first material 320 may be comprised of any material described in association with resonating member 304. In one embodiment, mass units 316, first material 320 and resonating member 304 are all comprised of the same material, as depicted in FIG. 3. In a specific embodiment, mass units 316, first material 320 and resonating member 304 are comprised of polycrystalline silicon/germanium with a germanium atomic concentration in the range of 50-70% and boron dopant impurity atoms with a total atomic concentration in the range of $1\times10^{18}$-$5\times10^{20}$ atoms/cm$^3$.

Second material 322 may also be comprised of any material described in association with resonating member 304. However, in accordance with an embodiment of the present invention, second material 322 is comprised of a material having a different thermal coefficient of expansion (TCE) than first material 320. In one embodiment, this TCE mismatch between first material 320 and second material 322 is at least $1.0\times10^{-6}$/° C. In an embodiment, the first material/second material 320/322 pairing is a pairing of an insulator and a semiconductor. In a specific embodiment, first material 320 is comprised of silicon/germanium while second material 322 is comprised of silicon dioxide. In an alternative embodiment, first material 320 is comprised of silicon dioxide while second material 322 is comprised of silicon/germanium. Second material 322 need not cover the entire length of first material 320. However, in accordance with an embodiment of the present invention, in order to maximize the performance of dynamic mass-load 308, second material 322 is continuous and covers a substantial portion of the length of first material 320 of dynamic mass-load 308. Although not shown, it is to be understood that second material 322 may be encapsulated by protective layers, including additional layers comprised of the same material as first material 320.

Drive electrode 312 and sensor electrode 314 may be comprised of any material described in association with resonating member 304. In accordance with an embodiment of the present invention, drive electrode 312 and sensor electrode 314 are comprised of substantially the same material as resonating member 304. Drive electrode 312 and sensor electrode 314 may be coupled with substrate 300 by conductive couplers, as depicted in FIG. 3. The conductive couplers may be comprised of any conductive material suitable to withstand a MEMS fabrication process. For example, in accordance with an embodiment of the present invention, the conductive couplers are comprised of a material selected from the group consisting of a semiconductor material heavily doped with charge-carrier impurity atoms and a conductor. In one embodiment, the conductive couplers are comprised of a heavily doped semiconducting material selected from the group consisting of silicon, germanium, silicon/germanium, carbon-doped silicon, carbon-doped silicon/germanium and a III-V material. In a specific embodiment, the conductive couplers are comprised of a group IV material heavily doped with charge-carrier impurity atoms selected from the group consisting of boron, indium, phosphorus, arsenic and antimony. For example, in a particular embodiment, the conductive couplers are comprised of polycrystalline silicon/germanium with a germanium atomic concentration in the range of 55-95% and boron dopant impurity atoms with a total atomic concentration in the range of $1 \times 10^{-20}$-$5 \times 10^{22}$ atoms/cm$^3$. In one embodiment, the conductive couplers are comprised of a conductor material and are formed from a material selected from the group consisting of copper, aluminum, a metal alloy and a metal silicide. In another embodiment, the conductive couplers are comprised of substantially the same material as drive electrode 312 and sensor electrode 314. In accordance with an embodiment of the present invention, the conductive couplers are for electrically coupling drive electrode 312 and sensor electrode 314 with a plurality of interconnects housed in substrate 300.

Anchor 310 may be comprised of any material described in association with resonating member 304 or electrodes 312 and 314 and their respective conductive couplers. In accordance with an embodiment of the present invention, anchor 310 is comprised of substantially the same material as the conductive couplers of electrodes 312 and 314. Anchor 310 may be comprised of a material suitable to affix resonating member 304 to substrate 300. Thus, in accordance with an embodiment of the present invention, anchor 310 is comprised of the same material as the conductive couplers for electrodes 312 and 314, but anchor 310 is provided for anchoring resonating member 304 while the conductive couplers are provided for electrically coupling drive electrode 312 and sensor electrode 314 with a plurality of interconnects housed in substrate 300. In one embodiment, anchor 310 is electrically isolated from a plurality of interconnects.

Substrate 300 may be comprised of any material suitable to withstand a MEMS fabrication process and to provide structural integrity for a MEMS structure having a suspended member. In an embodiment, substrate 300 is comprised of group IV-based materials such as crystalline silicon, germanium or silicon/germanium. In another embodiment, substrate 300 is comprised of a III-V material. Substrate 300 may also comprise an insulating layer. In one embodiment, the insulating layer is comprised of a material selected from the group consisting of silicon dioxide, silicon nitride, silicon oxy-nitride and a high-k dielectric layer. Substrate 300 may be an insulator. In one embodiment, substrate 302 consists of glass, quartz or sapphire. Substrate 300 may house a fabricated integrated circuit. For example, in accordance with an embodiment of the present invention, substrate 300 comprises an insulator layer above a plurality of interconnect structures connecting a plurality of micro-electronic devices. In one embodiment, the plurality of micro-electronic devices is a plurality of N-type and P-type transistors and the plurality of interconnect structures is a plurality of metal interconnects that tie the plurality of N-type and P-type transistors into an integrated circuit. Substrate 300 may comprise a top isolation stack comprised of any material suitable to electrically isolate resonating member 304 of MEMS structure 302 from a plurality of interconnects housed in substrate 300. For example, the isolation stack may be comprised of an insulating top layer. In one embodiment, the insulating top layer is comprised of a material selected from the group consisting of silicon dioxide, silicon nitride, silicon oxy-nitride and a high-k dielectric layer.

Figure 4A:
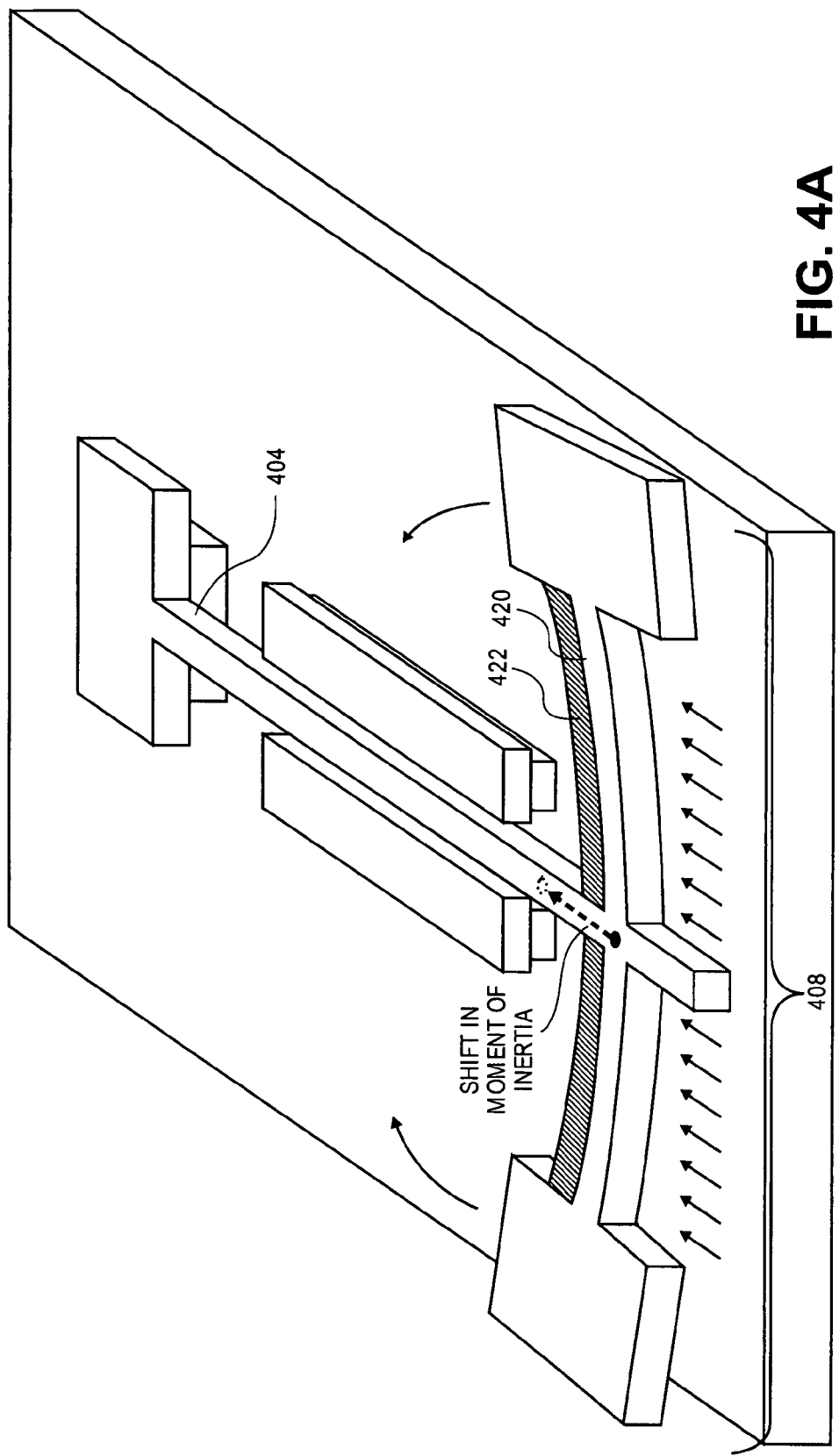
FIGS. 4A-B illustrate cross-sectional views representing the operation of a MEMS structure having a compensated resonating member, in accordance with an embodiment of the present invention.
Figure 4B:
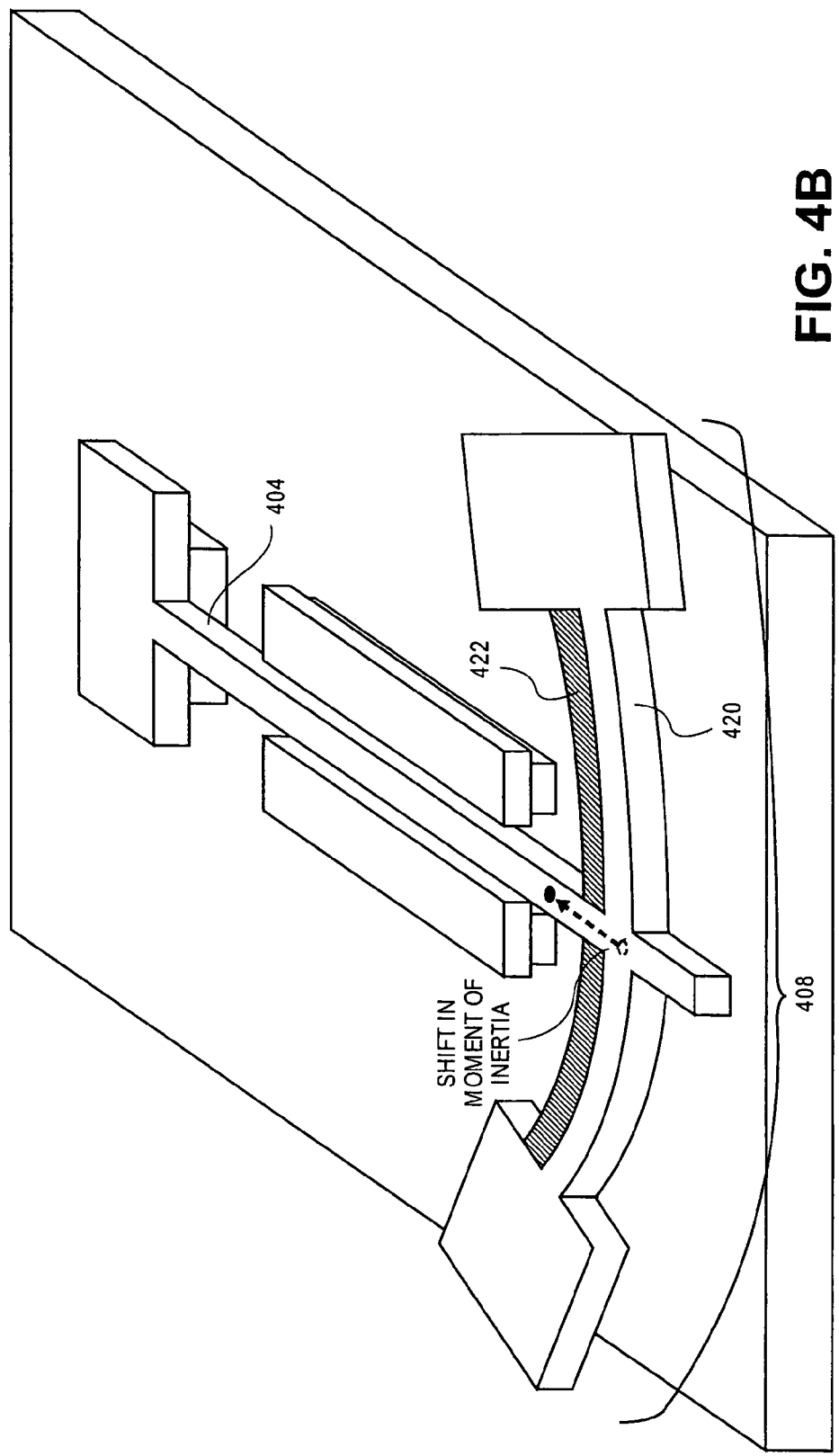

A dynamic mass-load that alters the moment of inertia of a resonating member may do so by deformation of a two-component arm in response to a TCE mismatch. FIGS. 4A-B illustrate cross-sectional views representing the operation of a MEMS structure having a compensated resonating member, in accordance with an embodiment of the present invention. Referring to FIG. 4A, a dynamic mass-load 408 is comprised of a first material 420 and a second material 422, each having a different TCE. Referring to FIGS. 4A and 4B, the two materials are arranged such that the dynamic mass-load deforms in response to a change in temperature—a consequence of the TCE mismatch. In one embodiment, the dynamic mass-load deforms to shift the moment of inertia of resonating member 404, thus altering the effective mass of resonating member 404. The dynamic mass-load may be comprised of any suitable pairing of TCE mismatched materials that alters the moment of inertia of resonating member 404 by an amount sufficient to compensate for a change in resonant frequency of resonating member 404 that results from a change in temperature. For example, the displacement of a dynamic mass-load comprised of a two-component arm may be represented by equation (1).

$$d = k\frac{L^2}{h}(\alpha_{material\#1} - \alpha_{material\#2})(T - T_0) \quad (1)$$

Referring to equation (1), d is the displacement distance, k is a constant of proportionality that depends on the Young's moduli of the two materials and is ~0.2 in many cases, L is the length of the two-component arm and h is the thickness of the two-component arm. The expression $(T-T_0)$ represents a change in temperature of dynamic mass-load 408 and, hence, of resonating member 404. The expression $(\alpha_{material\ \#1} - \alpha_{material\ \#2})$ represents the TCE mismatch between first material 420 and second material 422. In one embodiment, first material 420 is comprised of silicon/germanium and second material 422 is comprised of silicon dioxide. Thus, since $\alpha_{SiGe}=4.52 \times 10^{-6}/^{\circ}$ C. and $\alpha_{SiO2}=0.5 \times 10^{-6}/^{\circ}$ C., a 30 µm long two-component arm will have a displacement of approximately 0.07 µm over a 100° C. temperature range.

The deformation of a two-component dynamic mass-load may compensate for a change in resonant frequency of a resonating member. For example, in one embodiment, first material 420 is comprised of silicon/germanium, second material 422 is comprised of silicon dioxide, resonating member 408 is approximately 82 µm in length, 1.8 µm in width and 2 µm in height, the two-component arm is approximately 35.4 µm in length, and second material is 0.6 µm wide. The frequency variation of resonating member 408 is compensated (i.e. mitigated) to approximately 50 ppm over a 120° C. temperature range. In the absence of a compensating dynamic mass-load, resonating member 408 has a frequency variation in the range of 1000-5000 ppm over the same temperature range.

Thus, the frequency of a resonating member may be compensated by a dynamic mass-load. In accordance with an embodiment of the present invention, the resonant frequency of a resonating member decreases with increasing temperature. A dynamic mass-load compensates for the decreasing frequency by reducing the effective mass of the resonating member in response to the same temperature change, i.e. by moving the moment of inertia closer to an anchor of the resonating member. In an alternative embodiment, the resonant frequency of a resonating member increases with increasing temperature. A dynamic mass-load compensates for the increasing frequency by increasing the effective mass of the resonating member in response to the same temperature change, i.e. by moving the moment of inertia further from an anchor of the resonating member. It is to be understood that the present invention is not limited to a dynamic mass-load that responds to a change in temperature. In accordance with an embodiment of the present invention, the dynamic mass-load responds to an environmental change selected from the group consisting of pressure, light, electrical and chemical. Furthermore, it is to be understood that a dynamic mass-load may be positioned relative to a resonating member in any location suitable for the desired compensating performance of the dynamic mass-load. In another embodiment, the performance of a dynamic mass-load is optimized by selecting an appropriate mass for the mass-units of the dynamic mass-load.

A MEMS structure having a resonating member coupled with a dynamic mass-load may be fabricated by any technique suitable to pair materials having different TCEs. In one embodiment, for optimal integration of the MEMS structure with a pre-fabricated CMOS circuit, all process steps used to form the MEMS structure are carried out at a temperature less than approximately 450° C. In a specific embodiment, a damascene process is used to fabricate a MEMS structure having a resonating member coupled with a dynamic mass-load. FIGS. 5A-F illustrate cross-sectional views representing a series of steps for fabricating a MEMS structure having a compensated resonating member, in accordance with an embodiment of the present invention.

Figure 5A:
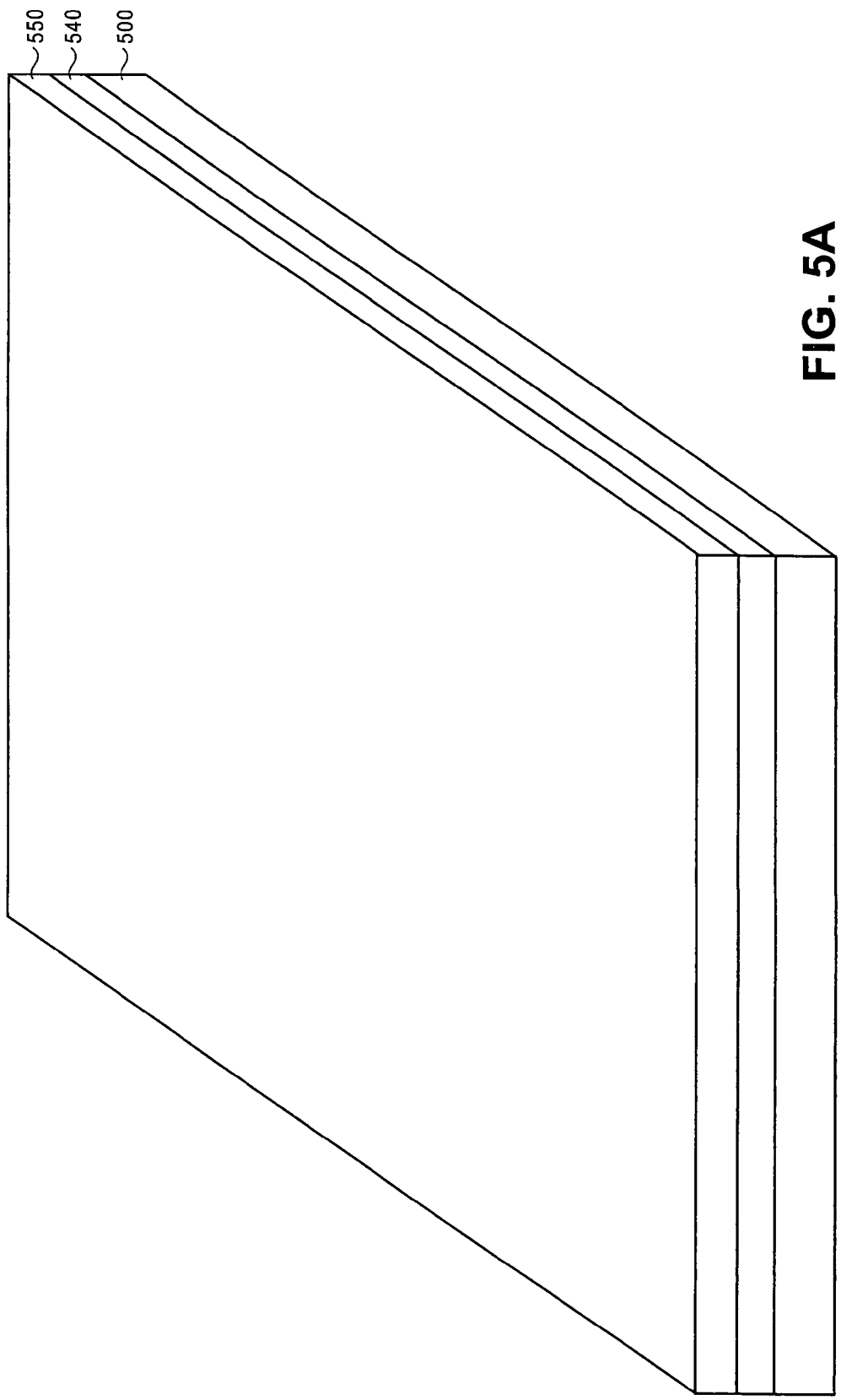
FIGS. 5A-F illustrate cross-sectional views representing a series of steps for fabricating a MEMS structure having a compensated resonating member, in accordance with an embodiment of the present invention.

Referring to FIG. 5A, a stacked structure is provided comprising a substrate 500 having a release layer 540 and a first structural layer 550. Substrate 500 and first structural layer 550 may be comprised of any material and have any feature described in association with substrate 300 and resonating member 304 described in association with FIG. 3.

First structural layer 550 may be deposited by any technique suitable to generate a uniform material layer of consistent composition. In accordance with an embodiment of the present invention, first structural layer 550 is deposited by a process selected from the group consisting of chemical vapor deposition, physical vapor deposition, atomic layer deposition, electroplating and electro-less plating deposition. In a specific embodiment, first structural layer is deposited by a low-pressure CVD process that utilizes the precursor gases $SiH_4$ and $GeH_4$ at a combined pressure in the range of 200-1000 mTorr. In one embodiment, first structural layer 550 is formed by first blanket depositing a material layer above release layer 340 and subsequently planarizing the material layer. First structural layer 550 may be comprised of a material that is formed by a low temperature process. Thus, in accordance with another embodiment of the present invention, first structural layer 550 is comprised of a material formed at a temperature less than approximately 450° C.

Release layer 540 may be comprised of any material suitable to withstand a MEMS fabrication process. For example, in accordance with an embodiment of the present invention, release layer 540 is comprised of a material selected from the group consisting of an insulator and a semiconductor. In one embodiment, release layer 540 is an insulating material and is comprised of a material selected from the group consisting of silicon dioxide, silicon nitride, silicon oxy-nitride and a high-K dielectric material. In one embodiment, release layer 540 is a semiconducting material and is selected from the group consisting of silicon, germanium, silicon/germanium, carbon-doped silicon, carbon-doped silicon/germanium and a III-V material. The semiconducting material may also be comprised of dopant impurity atoms. For example, in one embodiment, the semiconducting material is substantially comprised of germanium atoms and the concentration of dopant impurity atoms is selected to optimize the germanium nucleation at a temperature in the range of 300-400° C. In a specific embodiment, release layer 540 is comprised of greater than 98% germanium atoms along with boron dopant impurity atoms having a total atomic concentration in the range of $5 \times 10^{19} - 5 \times 10^{20}$ atoms/cm$^3$. Release layer 540 may be comprised of any material that can be removed with high selectivity to first structural layer 550. For example, in accordance with an embodiment of the present invention, first structural layer 550 is comprised of silicon/germanium and release layer 540 substantially comprises germanium. In a specific embodiment, both the silicon/germanium structural layer and the germanium release layer are doped with boron dopant impurity atoms. In another embodiment, first structural layer 550 is comprised of silicon/germanium and release layer 540 substantially comprises silicon.

Release layer 540 may be formed on substrate 500 by any suitable deposition process that generates a uniform material layer of consistent composition and is conformal to any patterning already present on the surface of substrate 500. For example, in accordance with an embodiment of the present invention, release layer 540 is deposited by a process selected from the group consisting of chemical vapor deposition, physical vapor deposition and atomic layer deposition. Release layer 540 may be deposited by a low temperature deposition process. In a specific embodiment, substrate 500 is comprised of an insulator layer above an integrated circuit and release layer 540 is deposited by a low-pressure chemical vapor deposition process at a temperatures less than 450° C. The thickness of release layer 540 may be any thickness suitable to provide a suspension height necessary for a desired MEMS application. For example, in accordance with an embodiment of the present invention, the thickness of release layer 540 determines the height at which a MEMS resonating member is subsequently suspended above substrate 500. In one embodiment, the thickness of release layer 540 is in the range of 0.1-5 microns.

Figure 5B:
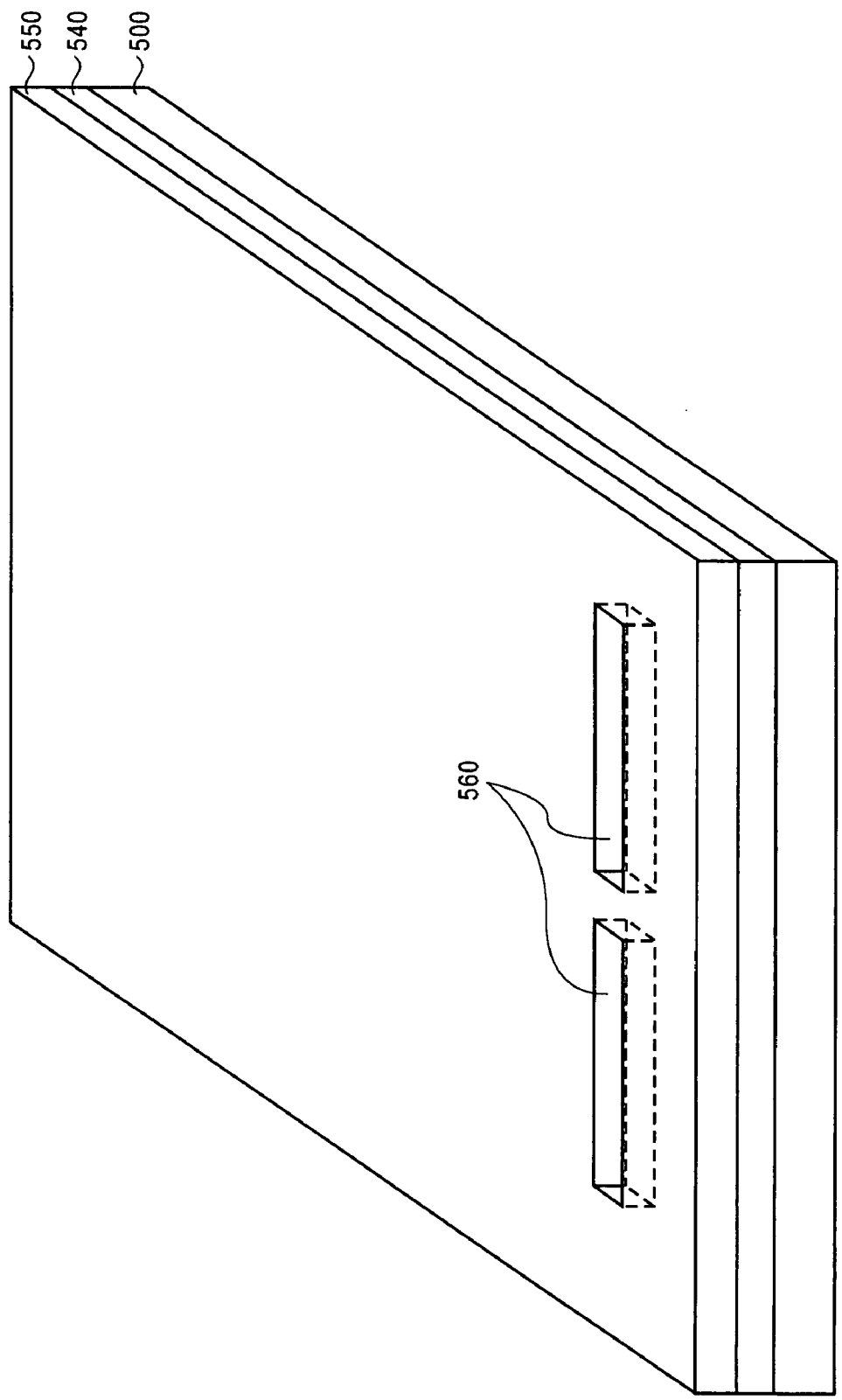

Referring to FIG. 5B, trenches 560 are formed in first structural layer 550. In accordance with an embodiment of the present invention, release layer 540 acts as an etch stop during the patterning of first structural layer 550 to form trenches 560. First structural layer 550 may be patterned by any lithographic/etch process suitable to provide an appropriately sized trench 560 and suitable to not etch a significant portion of release layer 540. For example, in accordance with an embodiment of the present invention, first structural layer 550 is patterned by first patterning a positive photo-resist layer above first structural layer 550 by exposure to a wavelength of light selected from the group consisting of 248 nm, 193 nm and 157 nm. In another embodiment, an e-beam direct-write process is used to pattern the positive photo-resist layer. An etch process may then be used to pattern first structural layer 550 with selectivity to release layer 540. In one embodiment, a dry etch process is used to etch first structural layer 550 with a selectivity to release layer 540 of at least 10:1. In a particular embodiment, first structural layer 550 is comprised substantially of silicon/germanium, release layer 540 is comprised substantially of germanium, and the dry etch process comprises an anisotropic plasma etch process wherein the plasma is generated from gases selected from the group consisting of $SF_6$ and the combination of HBr, $Cl_2$ and $O_2$. In one embodiment, although not depicted, a hard-mask layer is utilized in between the positive photo-resist layer and first structural layer 550.

Figure 5C:
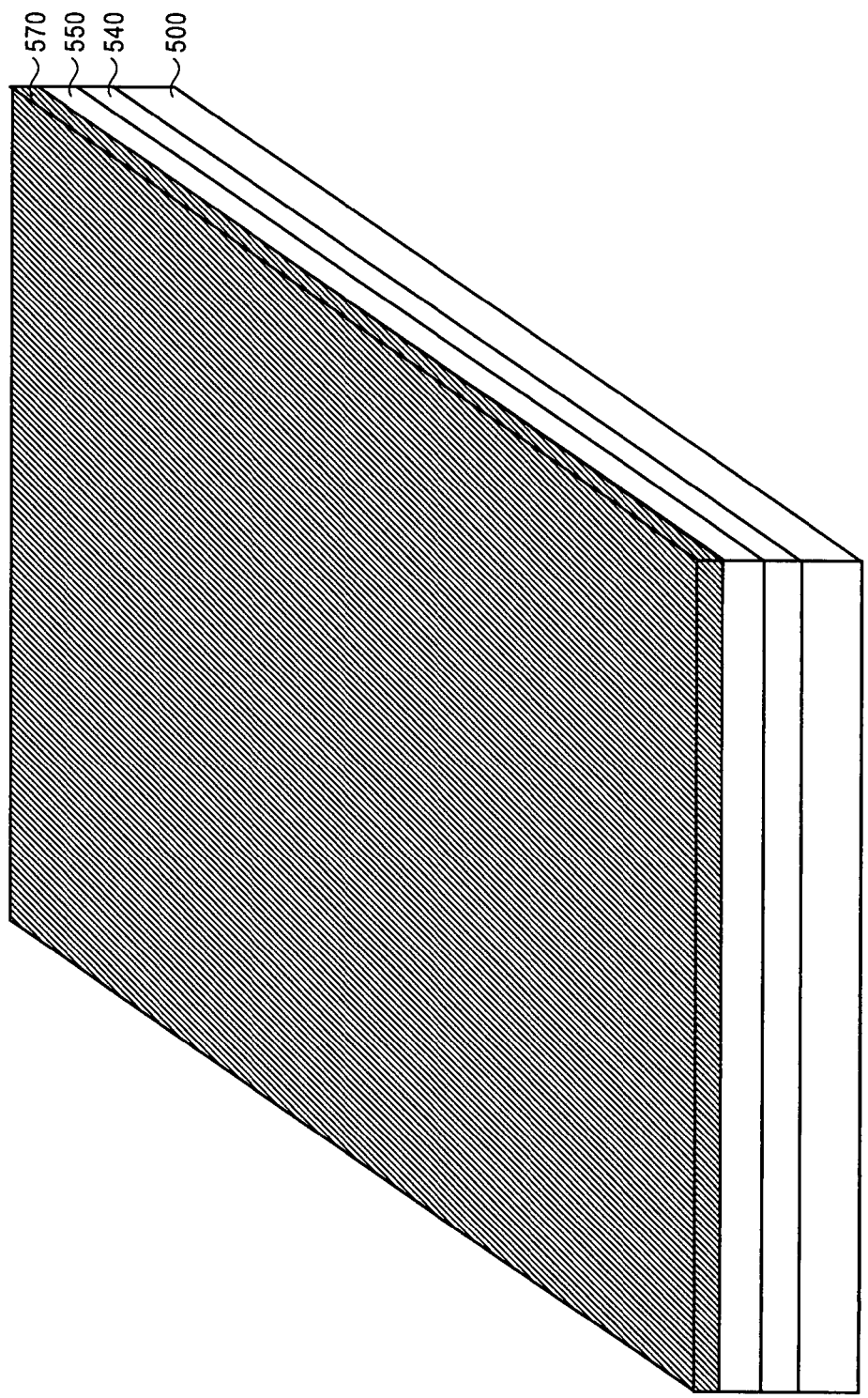

Referring to FIG. 5C, trenches 560 are filled with a second structural layer 570. Second structural layer 570 may be formed from any material suitable to withstand a MEMS fabrication process, to substantially fill trenches 560, and to satisfy the required characteristics of a dynamic mass-load. For example, in accordance with an embodiment of the present invention, second structural layer 570 is comprised of a material selected from the group consisting of an insulator, a semiconductor and a conductor. In one embodiment, second structural layer 570 is comprised of any material described in association with second material 322 from FIG. 3. In a specific embodiment, the first/second structural layer pairing 550/570 may be any TCE-mismatch pairing described in association with the first/second material pairing 320/322 from FIG. 3. Second structural layer 570 may be deposited by any technique described for the deposition of first structural layer 550. Thus, in accordance with an embodiment of the present invention, second structural layer 570 is comprised of a material formed at a temperature less than approximately 450° C.

Figure 5D:
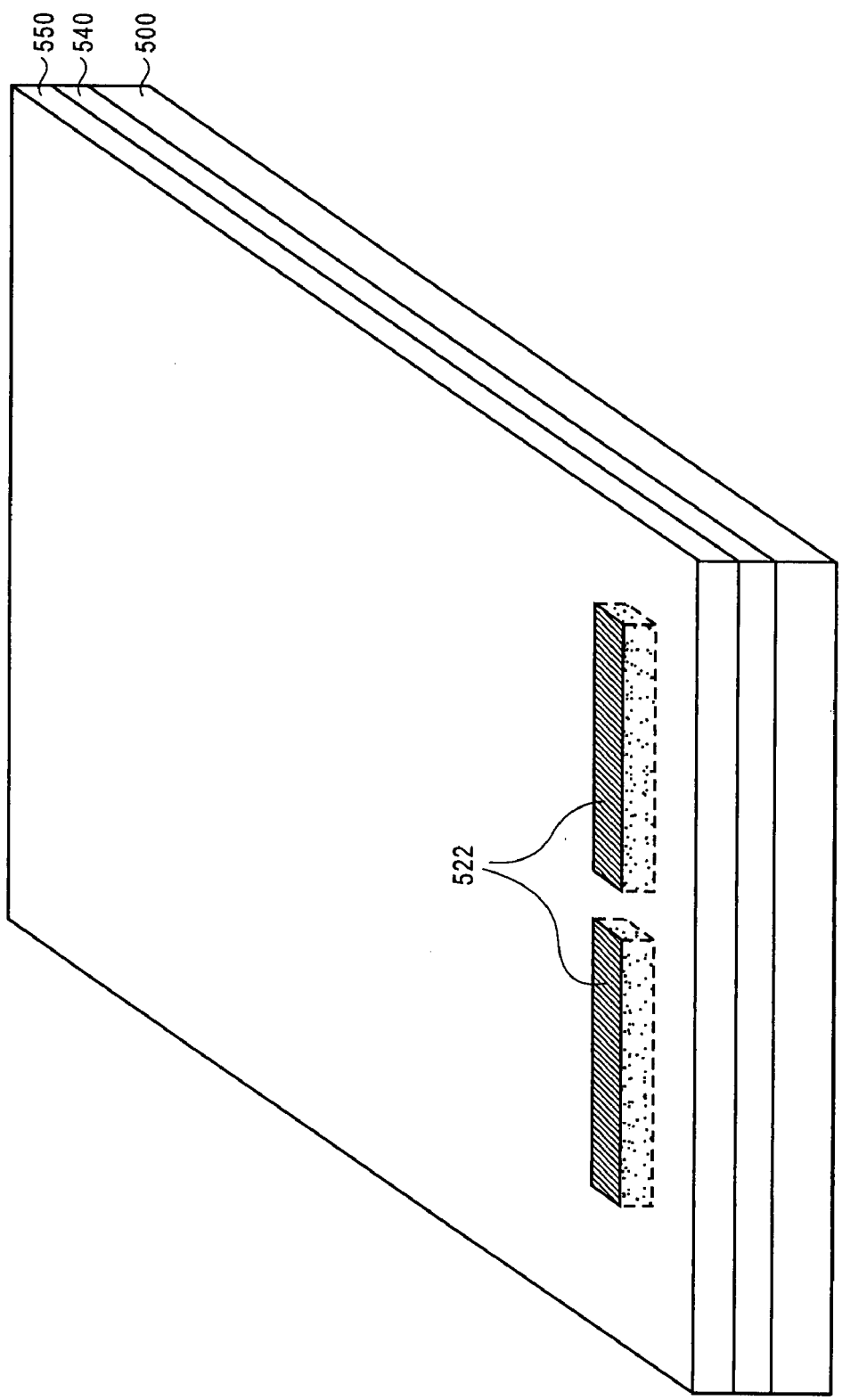

Referring to FIG. 5D, the portion of second structural layer 570 not in trenches 560 is removed. Thus, regions of second material 522 are formed. Removal of this portion of second structural layer 570 may be completed by using any suitable removal technique that has high selectivity to first structural layer 550. For example, in accordance with an embodiment of the present invention, the portion of second structural layer 570 not in trenches 560 is removed by a dry etch process wherein first structural layer 550 is used as an etch stop layer. In one embodiment, second structural layer 570 is an insulator layer and the etch gases used to generate a plasma for the dry etch process are selected from the group consisting of $CF_4$ or the combination $Cl_2$, HBr, $O_2$ and $BCl_3$. In accordance with another embodiment of the present invention, second structural layer 570 is planarized with a chemical-mechanical process step with an end-point determined by exposure of the top surface of first structural layer 550. In one embodiment, the portion of second structural layer 570 not in trenches 560 is removed by polishing with a slurry comprised of species selected from the group consisting of silica beads, ammonium hydroxide and water.

Figure 5E:
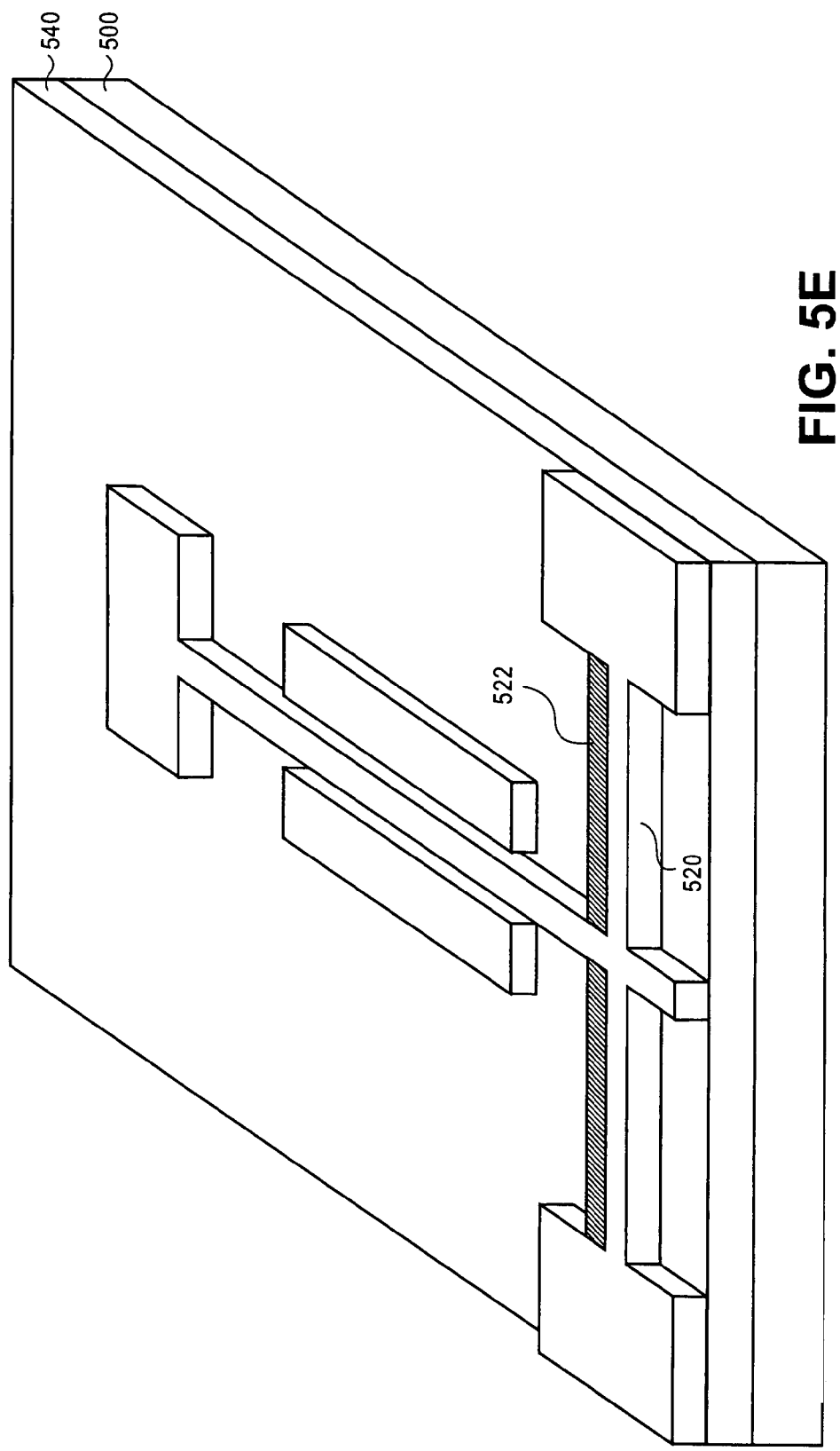

Referring to FIG. 5E, first structural layer 550 is patterned to expose the top surface of release layer 540. Thus, features for a MEMS resonator including regions of first material 520 directly adjacent regions of second material 522 are provided. First structural layer 550 may be patterned by any suitable patterning process that provides the required dimensions of a MEMS resonator. In one embodiment, First structural layer 550 is patterned by any lithographic/etch process described in association with the patterning of trenches 560 from FIG. 5B.

Figure 5F:
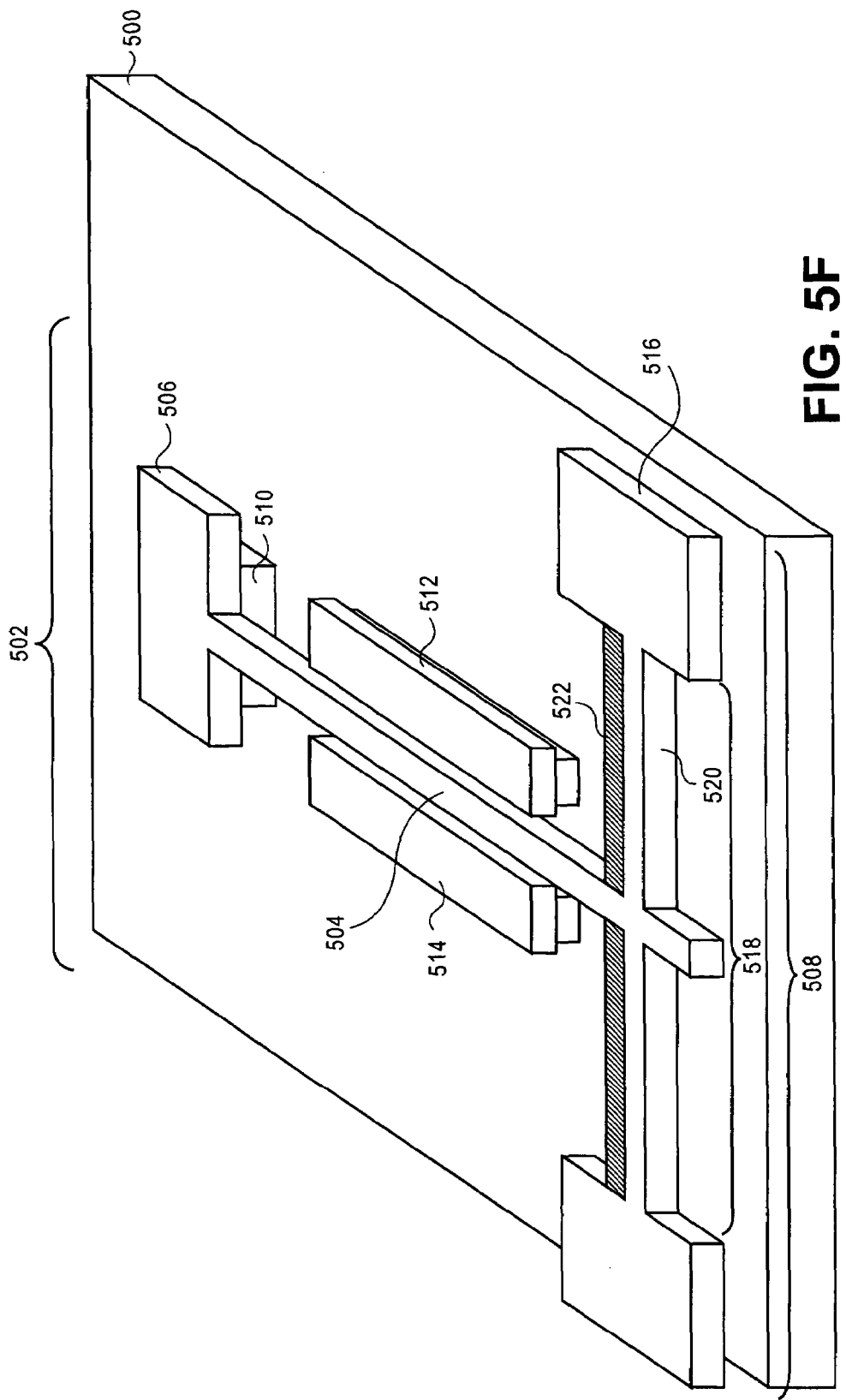

Referring to FIG. 5F, release layer 540 is removed to provide a MEMS structure 502 having a resonating member 504 and a base 506. Resonating member 504 is coupled with a dynamic mass-load 508 and is suspended between a drive electrode 512 and a sensor electrode 514. Dynamic mass-load 508 is comprised of a pair of mass units 516 and a two-component arm 518 comprised of first material 520 and second material 522. Release layer 540 may be removed by any technique that enables removal without significantly impacting first and second materials 520 and 522. For example, in accordance with an embodiment of the present invention, first material 520 comprises silicon/germanium, second material 522 comprises silicon dioxide, and release layer 540 substantially comprises germanium and is removed by an oxidizing etchant. In a specific embodiment, release layer 540 is comprised of germanium with an atomic concentration of greater than 98% germanium atoms and a wet etchant comprising an aqueous solution of $H_2O_2$ with a concentration in the range of 25-35% by volume and a temperature in the range of 80-95° C. is used to remove release layer 540. In a particular embodiment, release layer 540 is further comprised of boron dopant impurity atoms with a concentration in the range of $5 \times 10^{19}$-$5 \times 10^{20}$ atoms/cm$^3$. In accordance with another embodiment of the present invention, first material 520 comprises silicon/germanium, second material 522 comprises silicon dioxide, and release layer 540 substantially comprises silicon and is removed by a high pH etchant. In a specific embodiment, release layer 540 is comprised of silicon with an atomic concentration of greater than 99% silicon atoms and a wet etchant comprising an aqueous solution of $NH_4OH$ with a concentration in the range of 1-20% by volume and a temperature in the range of 15-40° C. is used to remove release layer 540. In a particular embodiment, release layer 540 is further comprised of phosphorus and/or arsenic dopant impurity atoms with a concentration in the range of $5 \times 10^{18}$-$1 \times 10^{20}$ atoms/cm$^3$. In an embodiment, release layer 540 is removed with a selectivity greater than 20:1 over first and second materials 520 and 522.

Anchor 510 that couples base 506 with substrate 500 along with conductive couplers for drive electrode 512 and sensor electrode 514 are also exposed upon the removal of release layer 540, as depicted in FIG. 5F. These conductive couplers and anchor may be fabricated by any suitable technique that substantially aligns them with drive electrode 512, sensor electrode 514 and resonating member 504, respectively. For example, in accordance with an embodiment of the present invention, release layer 540 is first patterned with trenches that expose a portion of substrate 500 prior to the deposition of first structural layer 550, i.e. prior to the process steps described in association with FIGS. 5A-F, thus enabling formation of the conductive couplers and anchor by way of a preliminary damascene process.

Figure 6A:
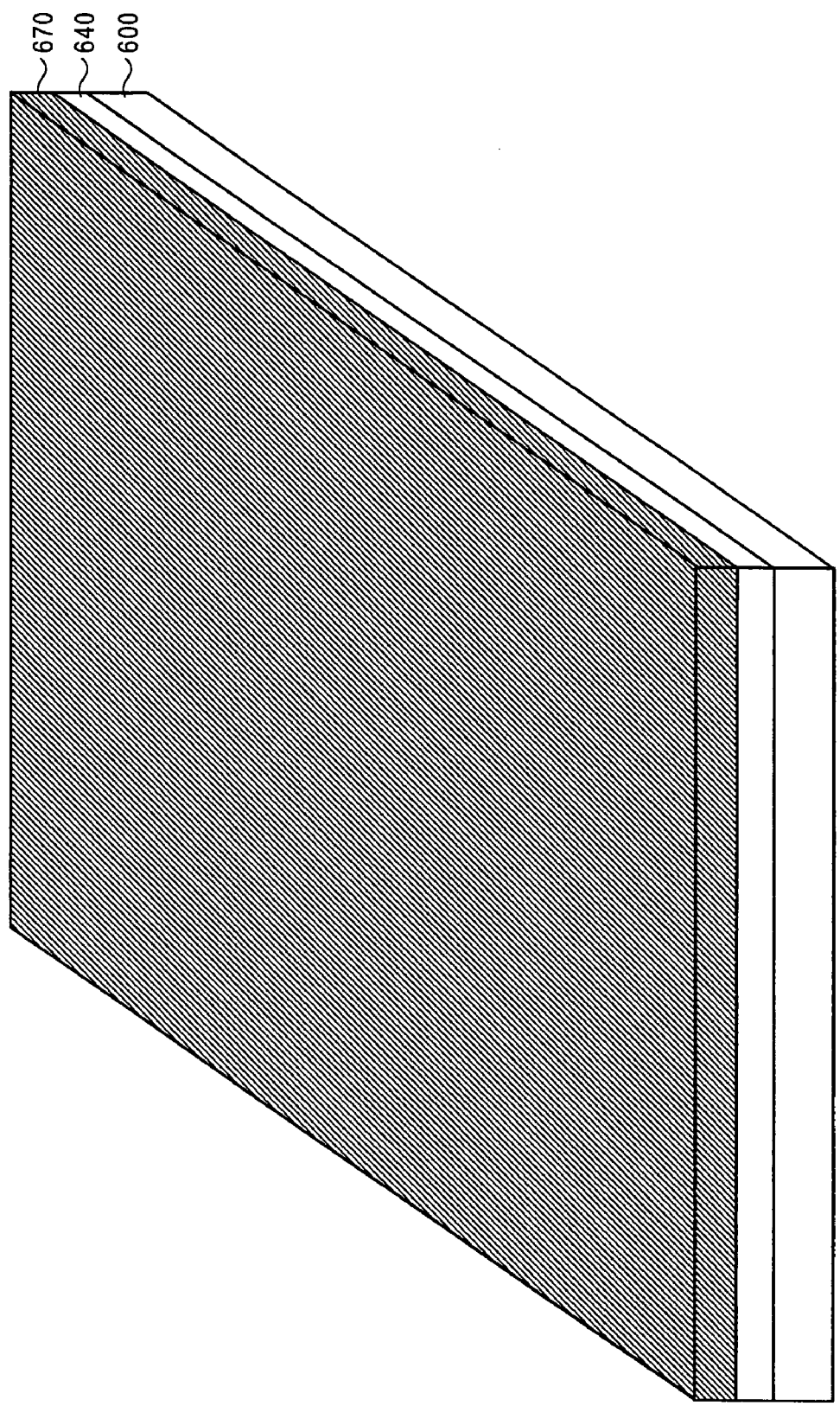
FIGS. 6A-C illustrate cross-sectional views representing a series of steps for fabricating a MEMS structure having a compensated resonating member, in accordance with an embodiment of the present invention.
Figure 6B:
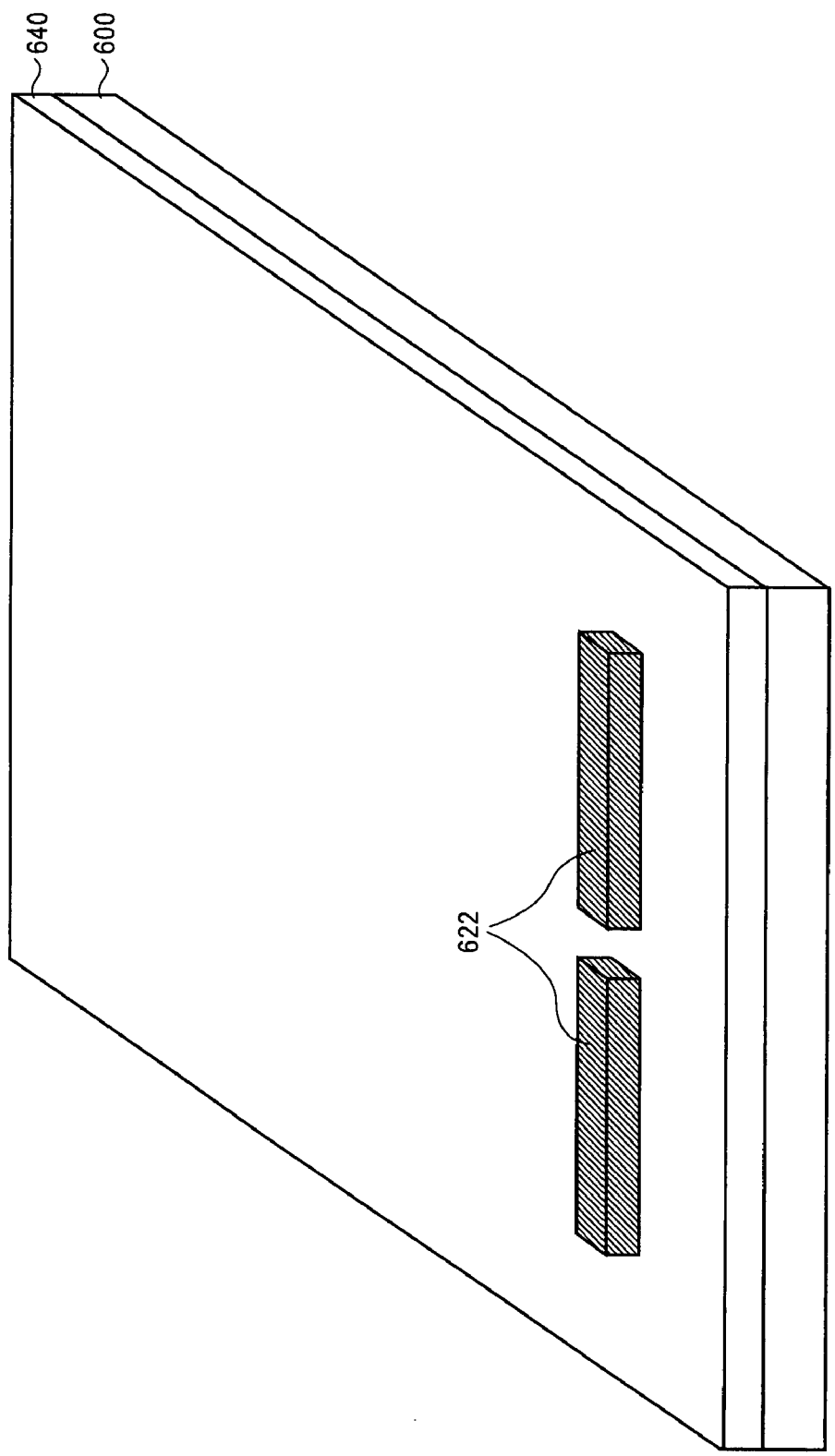
Figure 6C:
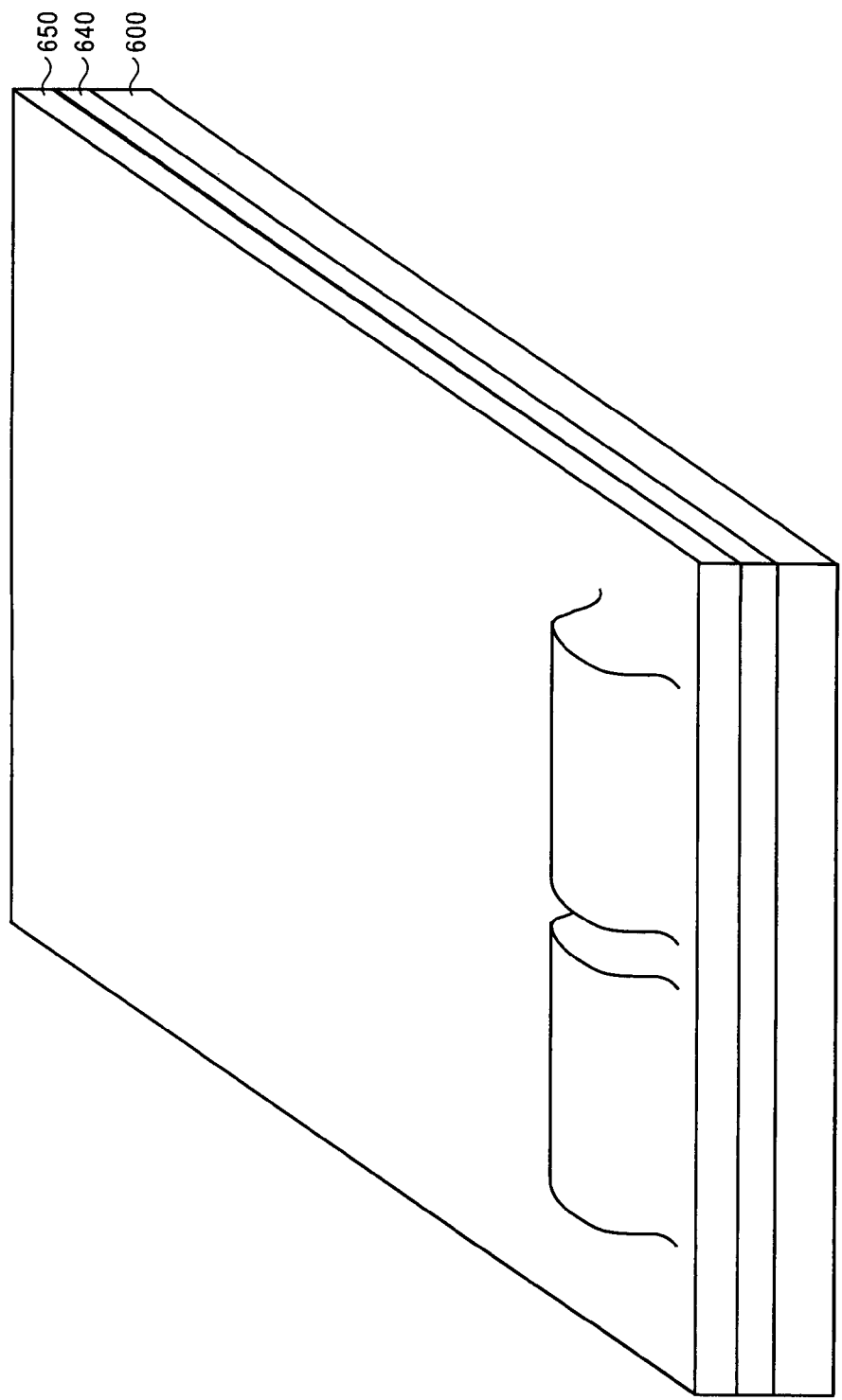

Thus, as illustrated in FIGS. 5A-F, the second material of a dynamic mass-load may be fabricated by a damascene process. Alternatively, the second material of a dynamic mass-load may be fabricated by a subtractive etch process. FIGS. 6A-C illustrate cross-sectional views representing a series of steps for fabricating a MEMS structure having a compensated resonating member, in accordance with another embodiment of the present invention.

Referring to FIG. 6A, a second structural layer 670 is formed above a release layer 640 on a substrate 600, prior to the formation of a first structural layer. Second structural layer 670, release layer 640 and substrate 600 may be comprised of any material and may be formed by any technique described in association with second structural layer 570, release layer 540 and substrate 500, respectively, from FIGS. 5A and 5C.

Referring to FIG. 6B, second structural layer 670 is patterned to provide regions of second material 622. Second structural layer 670 may be patterned by any process suitable to remove portions of second structural layer 670 with high selectivity to release layer 640 and to provide the desired dimensions of regions of second material 622. For example, in accordance with an embodiment of the present invention, second structural layer 670 is patterned by first patterning a positive photo-resist layer above second structural layer 670 by exposure to a wavelength of light selected from the group consisting of 248 nm, 193 nm and 157 nm. In another embodiment, an e-beam direct-write process is used to pattern the positive photo-resist layer. An etch process may then be used to pattern second structural layer 670 with selectivity to release layer 640. In one embodiment, a dry etch process is used to etch second structural layer 670 with a selectivity to release layer 640 of at least 10:1. In a particular embodiment, second structural layer 670 is comprised of silicon dioxide, release layer 640 is comprised substantially of germanium, and the dry etch process comprises an anisotropic plasma etch process wherein the plasma is generated from gases selected from the group consisting of $CF_4$ or the combination $Cl_2$, HBr, $O_2$ and $BCl_3$.

Referring to FIG. 6C, a first structural layer 650 is formed above regions of second material 622 and above the top surface of release layer 640. First structural layer 650 may be deposited by any process that provides a conformal layer over regions of second material 622. In accordance with an embodiment of the present invention, first structural layer 650 is comprised of any material and is deposited by any technique described in association with first structural layer 550 from FIG. 5A. Following the deposition, a portion of first structural layer 650 may be removed to provide a stack having a two-component structural layer above a release layer, similar to the stack depicted in FIG. 5D. Removal of this portion of first structural layer 650 may be carried out using any suitable removal technique that planarizes first structural layer 650 with high selectivity to regions of second material 622. For example, in accordance with one embodiment of the present invention, first structural layer 650 is planarized with a chemical-mechanical process step having an end-point determined by exposure of the top surface of regions of second material 622. In one embodiment, first structural layer 650 is planarized by polishing with a slurry comprised of species selected from the group consisting of silica beads, ammonium hydroxide and water. Following planarization of first structural layer 650, process steps described in association with FIGS. 5E and 5F may be employed to provide a MEMS structure having a resonating member coupled with a dynamic mass-load, wherein the dynamic mass-load is comprised of materials having different TCEs.

Thus, as illustrated in FIGS. 6A-C, the second material of a dynamic mass-load may be fabricated by a subtractive process. Alternatively, the second material of a dynamic mass-load may be provided in the form of a ribbon fabricated by a spacer process. FIGS. 7A-E illustrate cross-sectional views representing a series of steps for fabricating a MEMS structure having a compensated resonating member, in accordance with an alternative embodiment of the present invention.

Figure 7A:
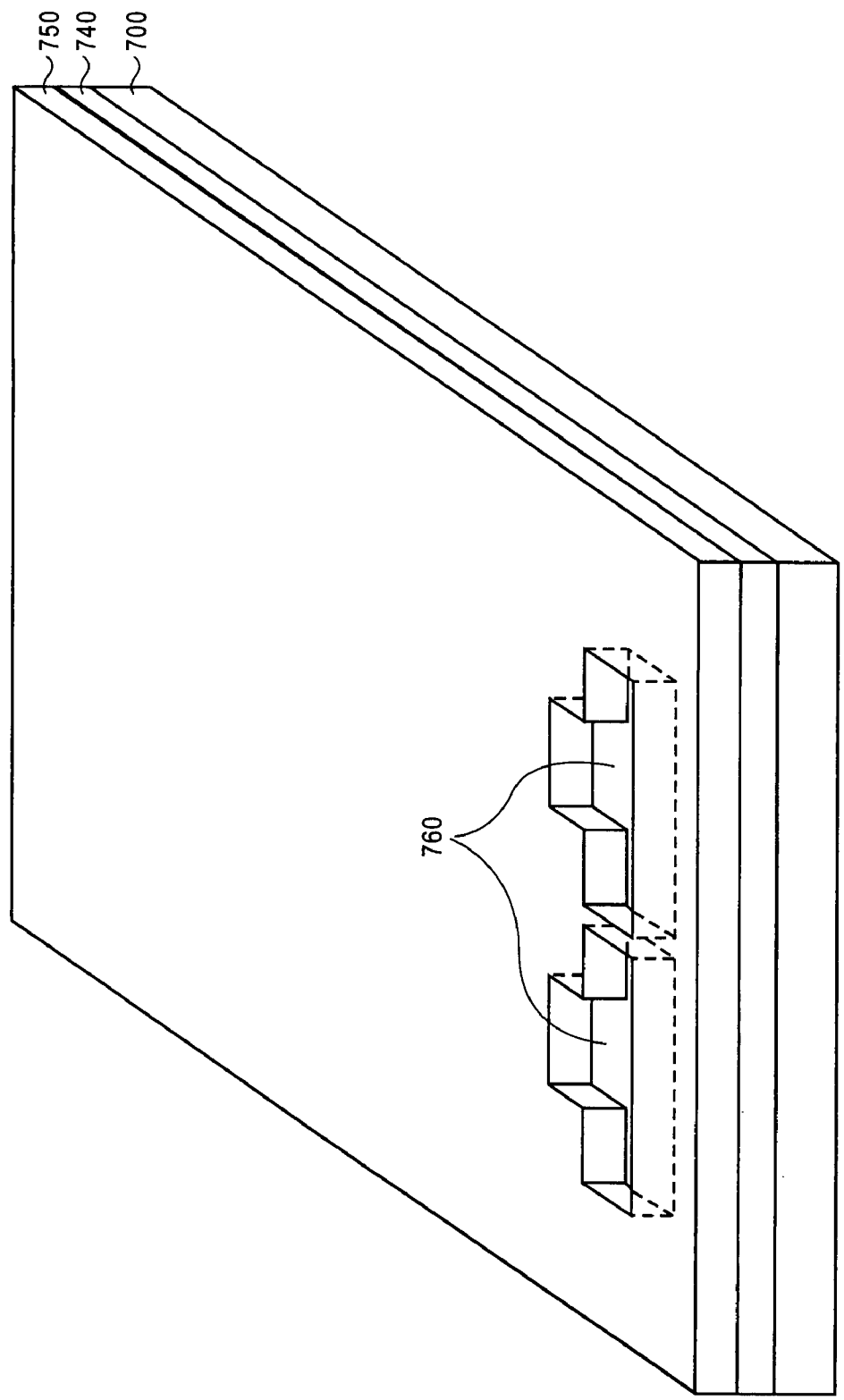
FIGS. 7A-E illustrate cross-sectional views representing a series of steps for fabricating a MEMS structure having a compensated resonating member, in accordance with an embodiment of the present invention.

Referring to FIG. 7A, a first structural layer 750 is formed above a release layer 740 on a substrate 700. First structural layer 750, release layer 740 and substrate 700 may be comprised of any material and may be formed by any technique described in association with first structural layer 550, release layer 540 and substrate 500, respectively, from FIGS. 5A and 5C. First structural layer 750 is patterned to form trenches 760, which expose the top surface of release layer 740, as depicted in FIG. 7A. Trenches 760 may be formed by any process described in association with the formation of trenches 560 from FIG. 5B.

Figure 7B:
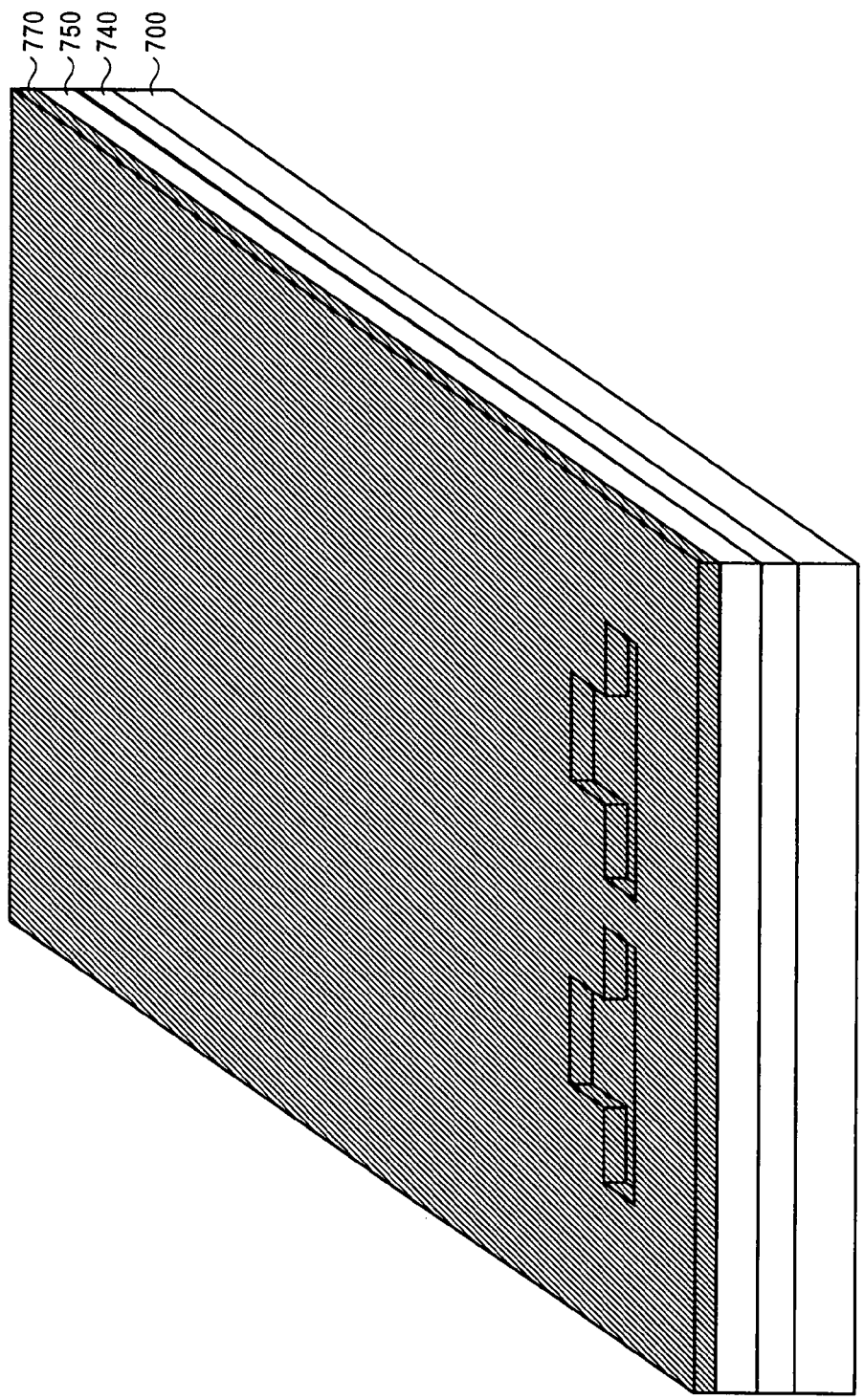

Referring to FIG. 7B, a second structural layer 770 is formed above first structural layer 750 and conformally in trenches 760. Second structural layer 770 may be comprised of any material and may be formed by any technique described in association with second structural layer 570 from FIG. 5C. As a spacer etch approach is subsequently used to form a second material region for a dynamic mass-load, the thickness of second structural layer 770 may be substantially equivalent to the desired width of the ribbon subsequently formed. That is, in accordance with an embodiment of the present invention, the width of the portion of second structural layer 770 on the sidewalls of trenches 760 is substantially the same as the thickness of second structural layer 770. In one embodiment, the thickness of second structural layer 770 is in the range of 500-2000 nanometers.

Figure 7C:
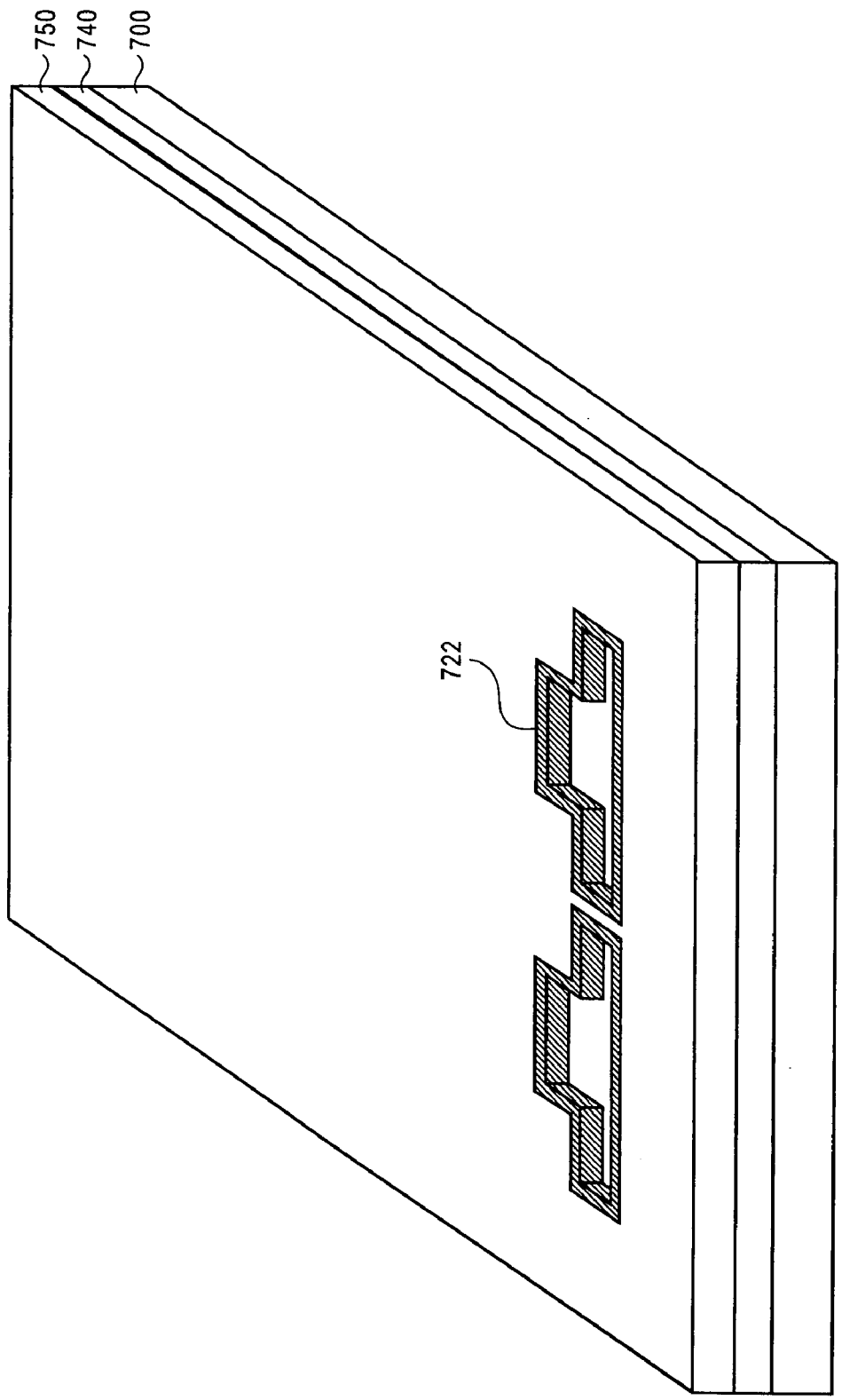

Referring to FIG. 7C, second structural layer 770 is anisotropically patterned to provide a ribbon 722 comprised of the material of second structural layer 770. A portion of release layer 740 is also exposed. Thus, in accordance with an embodiment of the present invention, a spacer etch process is used to provide a ribbon of structural material different from first structural layer 750. Ribbon 722 may be formed from second structural layer 770 by any anisotropic process that removes surface portions of second structural layer 770 selective to first structural layer 750. Thus, in accordance with an embodiment of the present invention, ribbon 722 is formed during a plasma etch process step. In one embodiment, second structural layer 770 is comprised of silicon dioxide and the gases used to generate the plasma are selected from the group consisting of $CF_4$ and the combination $Cl_2$, HBr, $O_2$ and $BCl_3$. In a specific embodiment, an end point for the etch process is detected when the surface of at least one of first structural layer 750 or release layer 740 is exposed.

Figure 7D:
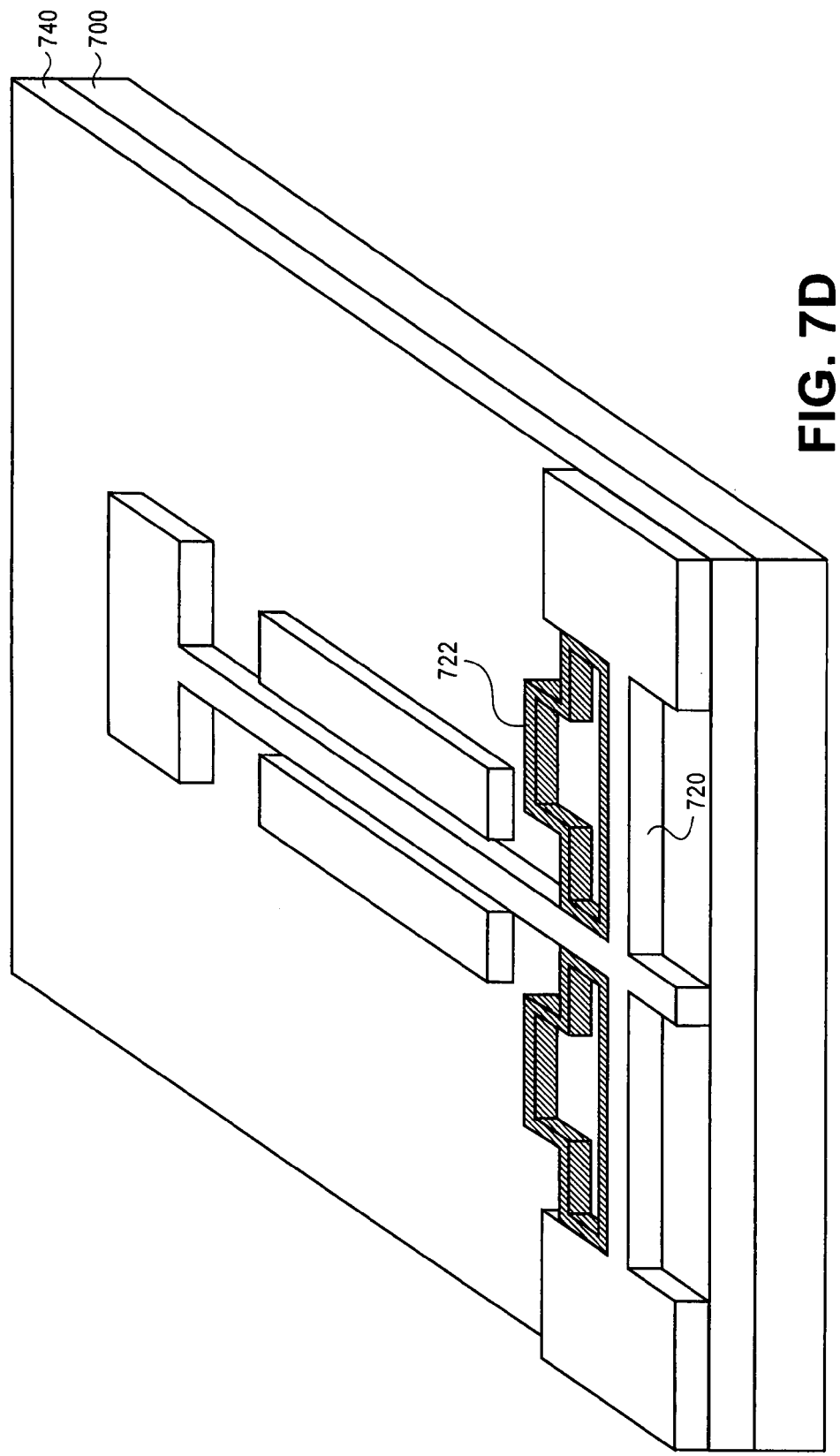
Figure 7E:
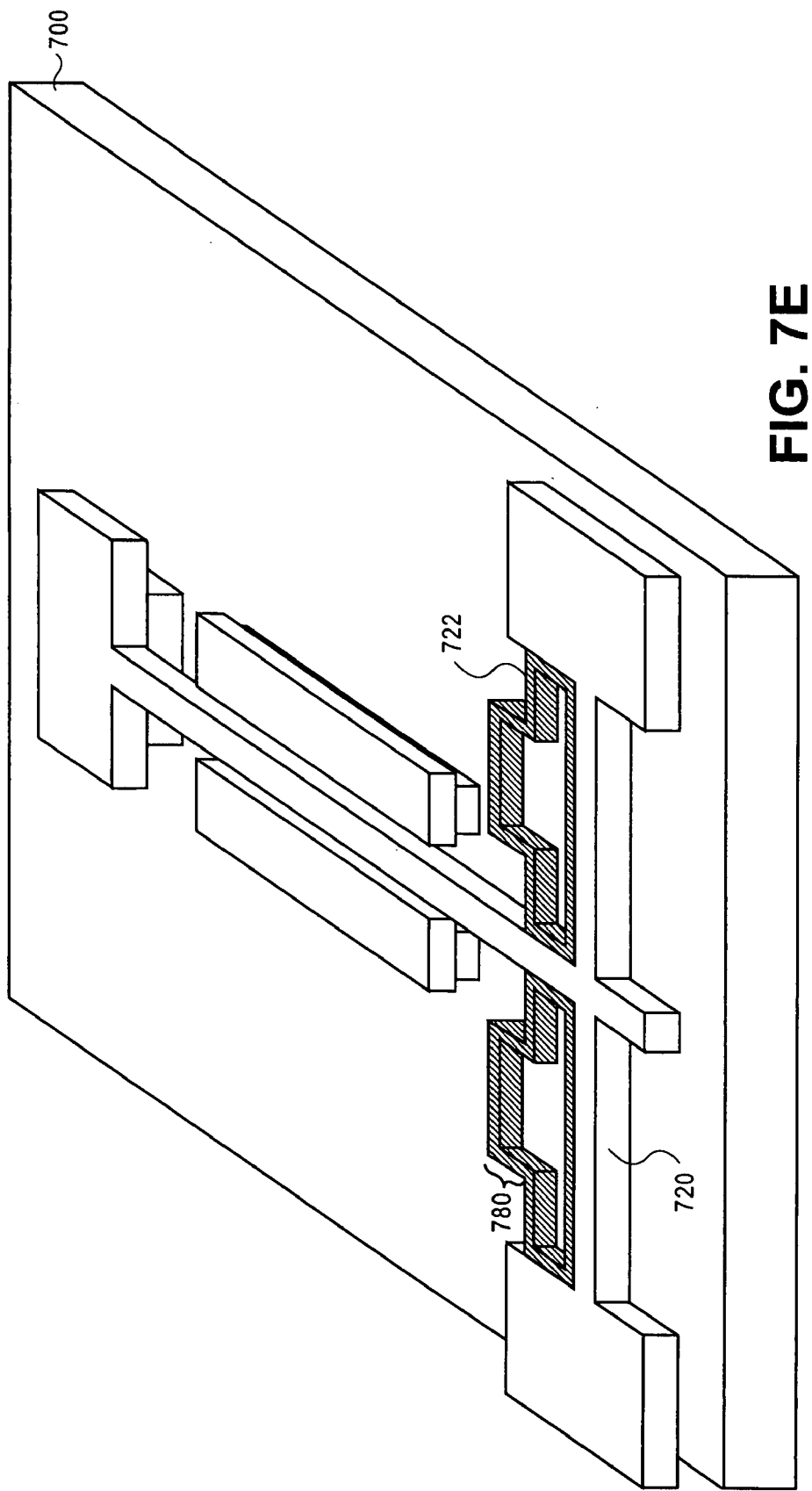

Referring to FIG. 7D, first structural layer 750 is patterned to expose the top surface of release layer 740 and to provide features for a MEMS resonator including regions of first material 720 directly adjacent to ribbons 722. First structural layer 750 may be patterned by any process described in association with the patterning of first structural layer 550 from FIG. 5B. Referring to FIG. 7E, release layer 740 is removed with high selectivity to the patterned structural layer having regions of first material 720, to ribbon 722 and to substrate 700. Release layer 740 may be removed by any technique described in association with the removal of release layer 540 from FIG. 5F. Thus, a MEMS structure having a resonating member coupled with a dynamic mass-load, wherein the dynamic mass-load is comprised of a first material and a ribbon having different TCEs, may be provided. The shape of ribbon 722 may include a spring extension 780. In one embodiment, spring extension 780 is an artifact of the patterning process used to form ribbon 722. In a specific embodiment, spring extension 780 minimizes the restoring stiffness of ribbon 722.

Figure 8A:
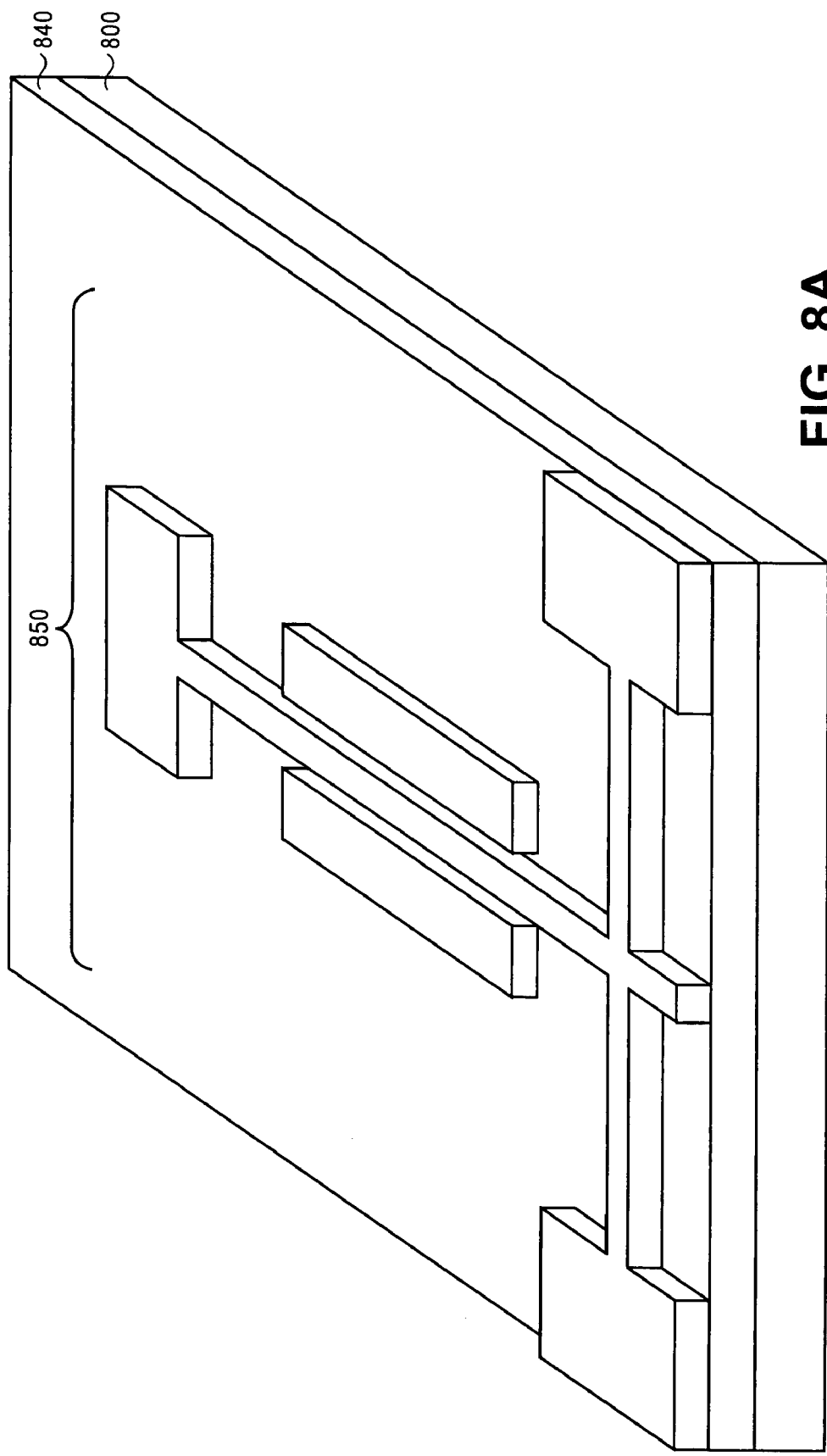
FIGS. 8A-C illustrate cross-sectional views representing a series of steps for fabricating a MEMS structure having a compensated resonating member, in accordance with an embodiment of the present invention.
Figure 8B:
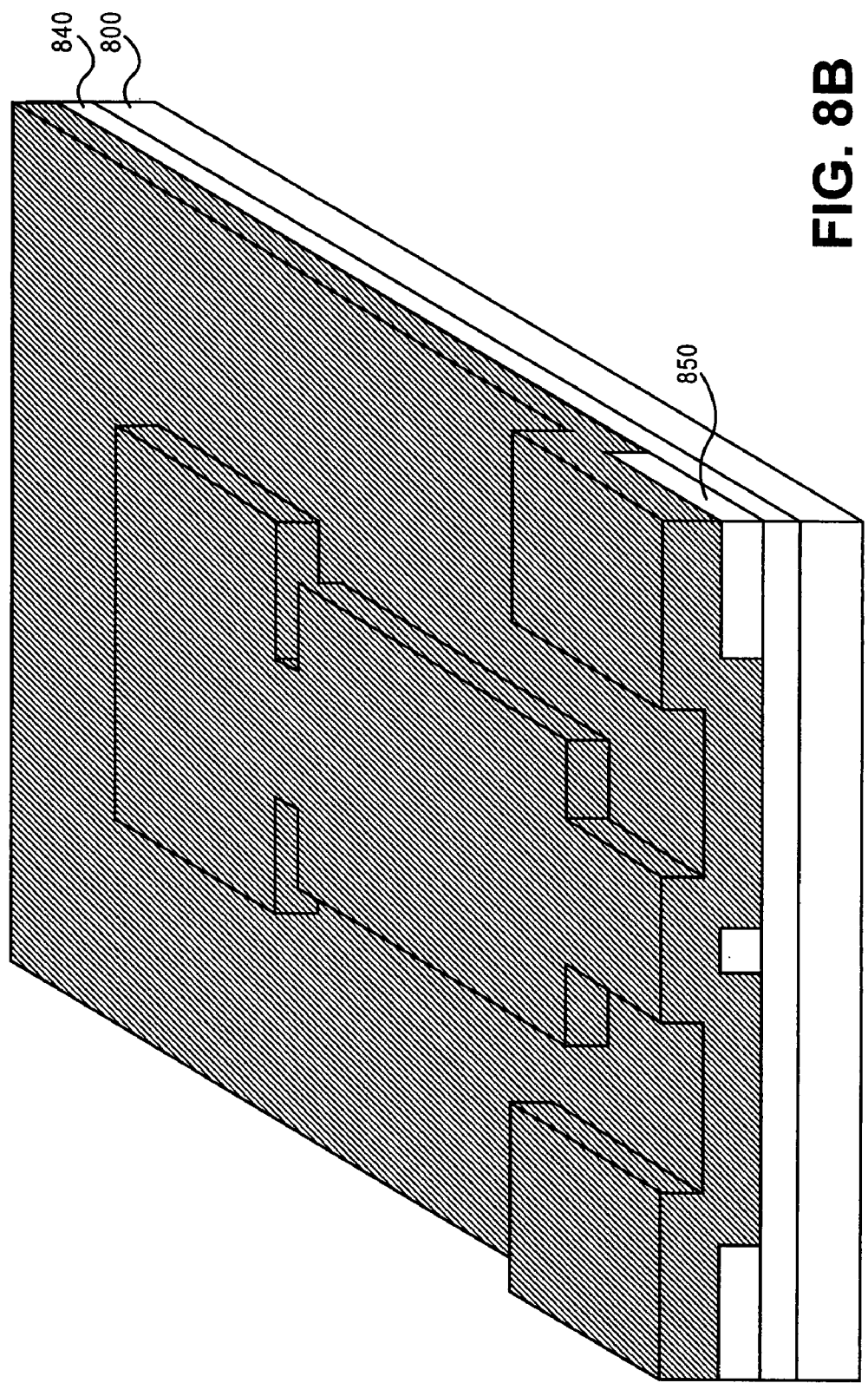
Figure 8C:
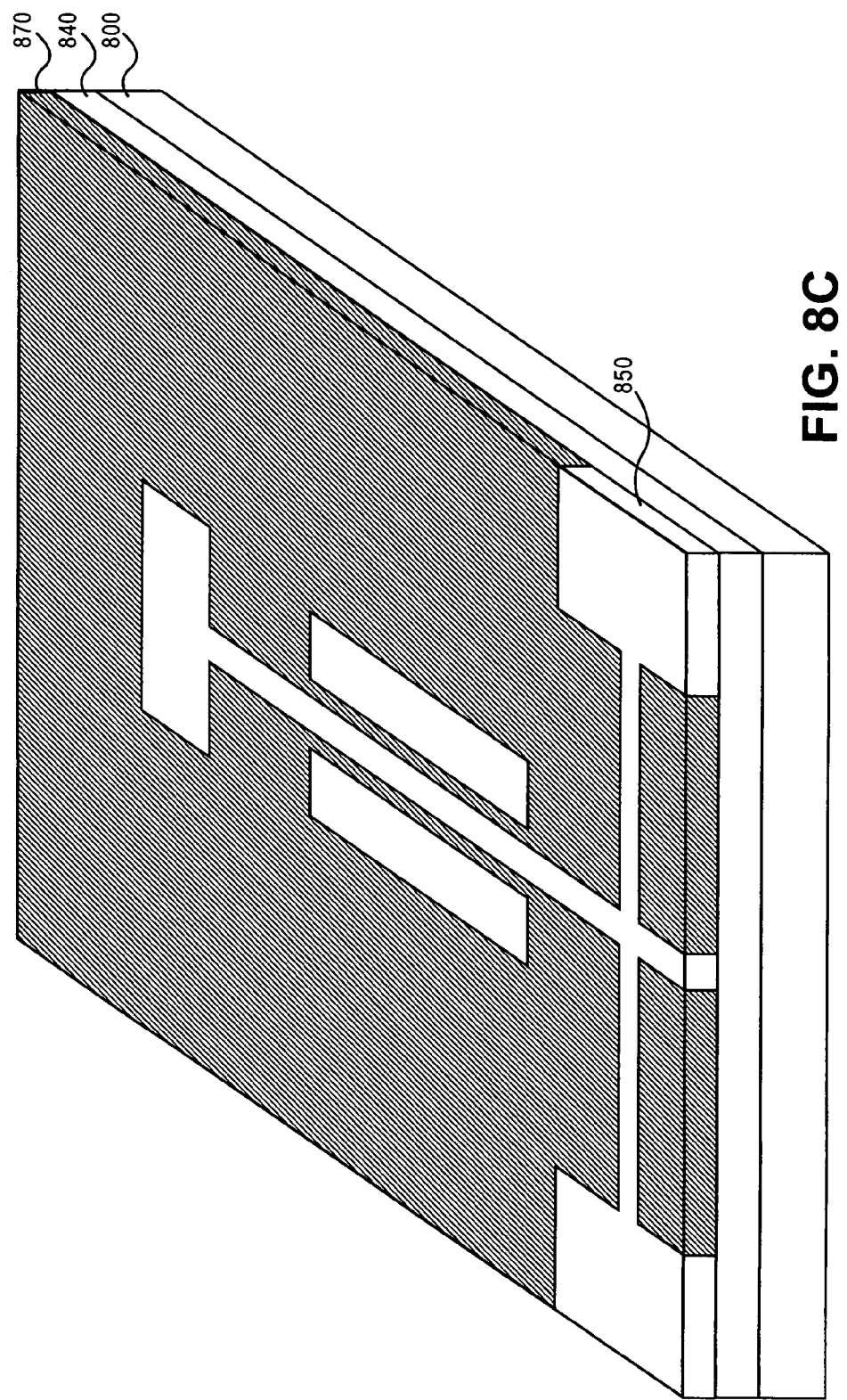

Thus, as illustrated in FIGS. 7A-E, a second material of a dynamic mass-load may be incorporated by a spacer process to provide a ribbon comprised of the second material. Alternatively, the features of a MEMS structure may be patterned prior to the formation of the second material component of a dynamic mass-load. FIGS. 8A-C illustrate cross-sectional views representing a series of steps for fabricating a MEMS structure having a compensated resonating member, in accordance with an embodiment of the present invention.

Referring to FIG. 8A, a first structural layer 850 is patterned to provide the features of a MEMS structure above a release layer 840 and substrate 800. In one embodiment, first structural layer 850, release layer 840 and substrate 800 are comprised of any material and are formed by any technique described in association with first structural layer 550, release layer 540 and substrate 500, respectively, from FIG. 5A. Referring to FIG. 8B, a second structural layer 870 is deposited conformally above the pattern formed in first structural layer 850 and the exposed surfaces of release layer 840. In one embodiment, second structural layer 870 is comprised of any material and is formed by any technique described in association with second structural layer 570 from FIG. 5C. Referring to FIG. 8C, second structural layer 870 is planarized to expose the top surface of patterned first structural layer 850. In one embodiment, second structural layer is planarized by any technique described in association with the planarization of second structural layer 570 from FIG. 5D. Following planarization of second structural layer 870, process steps described in association with FIGS. 5E and 5F may be employed to provide a MEMS structure having a resonating member coupled with a dynamic mass-load, wherein the dynamic mass-load is comprised of materials having different TCEs. That is, in accordance with an embodiment of the present invention, second structural layer 870 from the stack illustrated in FIG. 8C is patterned to provide a stack substantially similar to the stack illustrated in FIG. 5E. In one embodiment, second structural layer 870 is patterned by any patterning process described in association with the patterning of second structural layer 670 from FIGS. 6A and 6B.

Figure 9:
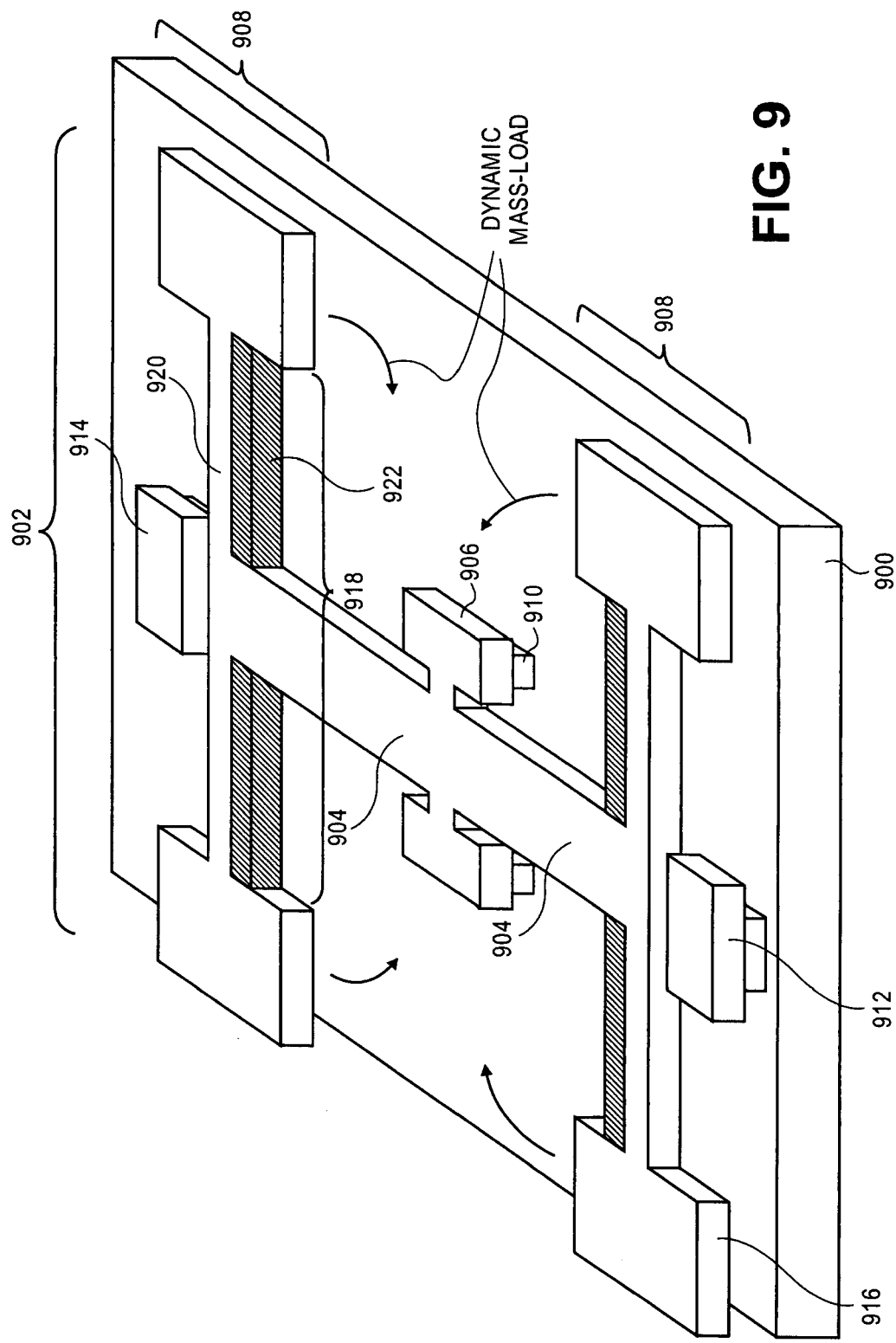
FIG. 9 illustrates a cross-sectional view representing a MEMS structure having a centrally-anchored compensated resonating member, in accordance with an embodiment of the present invention.

The present invention is not limited to a MEMS structure having a single anchor point or a MEMS structure having only one dynamic mass-load. For example, a MEMS resonator may be fabricated wherein a resonating member is centrally anchored and two dynamic mass-loads are utilized to alter the effective mass of the resonating member in response to an environmental change. FIG. 9 illustrates a cross-sectional view representing a MEMS structure having a centrally-anchored compensated resonating member, in accordance with an embodiment of the present invention.

Referring to FIG. 9, a MEMS structure 902 comprises a resonating member 904 and a centrally located base 906. Resonating member 904 is coupled with two dynamic mass-loads 908 and centrally located base 906 is coupled with substrate 900 by an anchor 910. Resonating member 904 is suspended between a drive electrode 912 and a sensor electrode 914. Dynamic mass-loads 908 each comprise a pair of mass units 916 and a two-component arm 918 comprised of a first material 920 and a second material 922. In accordance with an embodiment of the present invention, the two dynamic mass-loads 908 move toward one another to reduce the effective mass of resonating member 904 in response to an increase in temperature, as depicted by the arrows in FIG. 9.

The present invention is also not limited to two-component dynamic mass-loads. For example, a dynamic mass-load may be fabricated comprising a three-component arm. FIG. 10 illustrates a cross-sectional view representing a MEMS structure having a compensated resonating member and a dynamic mass-load comprising more than two materials with mismatched TCEs, in accordance with an embodiment of the present invention.

Referring to FIG. 10, a MEMS structure 1002 comprises a resonating member 1004 and a base 1006. Resonating member 1004 is coupled with a dynamic mass-load 1008 and base 1006 is coupled with substrate 1000 by an anchor 1010. Resonating member 1004 is suspended between a drive electrode 1012 and a sensor electrode 1014. Dynamic mass-load 1008 comprises a pair of mass units 1016 and a three-component arm 1018 having a first material 1020, a second material 1022, and a third material 1090. In accordance with an embodiment of the present invention, the TCE of third material 1090 is greater than the TCE of first material 1020 which is greater than the TCE of second material 1022. Thus, dynamic mass-load 1008 moves toward anchor 1010 to reduce the effective mass of resonating member 1004 in response to an increase in temperature, as depicted by the arrows in FIG. 10. Third material 1090 need not extend the entire length of first material 1020, as depicted in FIG. 10.

Thus, a MEMS structure having a compensated resonating member has been disclosed. In an embodiment, a MEMS structure comprises a resonating member coupled to a substrate by an anchor. A dynamic mass-load is coupled with the resonating member. The dynamic mass-load is provided for compensating a change in frequency of the resonating member by altering the moment of inertia of the resonating member by way of a positional change relative to the anchor. In one embodiment, the dynamic mass-load compensates the resonating member in response to an environmental change selected from the group consisting of temperature, pressure, light, electrical and chemical. In a specific embodiment, all process steps used to form the MEMS resonator are carried out at a temperature less than approximately 450° C.

What is claimed is:

1. A MEMS structure, comprising:
a cantilever resonating member;
an anchor to couple said cantilever resonating member with a substrate; and
a dynamic mass-load coupled with said cantilever resonating member, wherein said dynamic mass-load is for compensating a change in frequency of said cantilever resonating member by altering the moment of inertia of said cantilever resonating member by way of a positional change relative to said anchor.

2. The structure of claim 1, wherein said dynamic mass-load is for compensating said cantilever resonating member in response to a change in temperature.

3. The structure of claim 1, wherein said dynamic mass-load is for altering the moment of inertia of said cantilever resonating member by deformation due to a TCE mismatch.

4. The structure of claim 3 wherein said TCE mismatch is at least $1.0 \times 10^{-6}/°$ C.

5. The structure of claim 3, wherein said dynamic mass-load comprises a multi-component arm coupled with said cantilever resonating member, and a mass-system coupled with said multi-component arm.

6. The structure of claim 5, wherein said multi-component arm is coupled orthogonally with said cantilever resonating member approximately at the center of said multi-component arm, and wherein said mass-system comprises two suspended mass-units, with one suspended mass-unit on either end of said multi-component arm.

7. The structure of claim 5, wherein said multi-component arm is a two-component arm, each component consisting of a material having a different TCE than the material of the other component.

8. The structure of claim 7, wherein one of the components consists of the same material as the material of said cantilever resonating member.

9. The structure of claim 5, wherein said multi-component arm is a three-component arm, each component consisting of a material having a different TCE than the materials of the other components.

10. The structure of claim 9, wherein one of the components consists of the same material as the material of said cantilever resonating member.

11. The structure of claim 2, wherein said dynamic mass-load is configured to decrease the moment of inertia of said cantilever resonating member in response to an increase in temperature.

12. The structure of claim 2, wherein said dynamic mass-load is configured to increase the moment of inertia of said cantilever resonating member in response to an increase in temperature.

13. A MEMS structure, comprising:
a resonator member disposed above a substrate;
an anchor disposed between and end of said resonator member and said substrate, and coupled with both said end of said resonator member and said substrate;
a mass-load comprising a multi-component arm coupled with said resonator member; and
a pair of electrodes, each electrode coupled with said substrate and disposed on an opposing side of said resonator member, between said anchor and said mass-load.

14. The structure of claim 13, wherein said multi-component arm is coupled orthogonally with said resonator member, approximately at the center of said multi-component arm.

15. The structure of claim 13, wherein said multi-component arm is a two-component arm, each component consisting of a material having a different TCE than the material of the other component, and one of one of the components consisting of the same material as the material of said resonator member.

16. The structure of claim 13, wherein said multi-component arm is a three-component arm, each component consisting of a material having a different TCE than the materials of the other components, and one of the components consisting of the same material as the material of said resonator member.

17. The structure of claim 13, wherein said resonator member comprises silicon/germanium, and wherein said multi-component arm comprises silicon/germanium and silicon dioxide.

18. The structure of claim 13, wherein said resonator member is a cantilever.

* * * * *